United States Patent [19]

Kakuishi

[11] Patent Number: 5,249,145
[45] Date of Patent: Sep. 28, 1993

[54] TRANSFORMING ADAPTORS FOR WAVE DIGITAL FILTER AND BALANCING NETWORK USING SAME

[75] Inventor: Mitsuo Kakuishi, Yokohama, Japan

[73] Assignee: Fujitsu Limited, Kawasaki, Japan

[21] Appl. No.: 679,016

[22] PCT Filed: Aug. 31, 1990

[86] PCT No.: PCT/JP90/01120
§ 371 Date: Apr. 30, 1991
§ 102(e) Date: Apr. 30, 1991

[87] PCT Pub. No.: WO91/03872
PCT Pub. Date: Mar. 21, 1991

[30] Foreign Application Priority Data

Aug. 31, 1989 [JP] Japan .................. 1-223258

[51] Int. Cl.⁵ .............................. G06F 15/31
[52] U.S. Cl. ...................... 364/724.14; 364/825
[58] Field of Search ............... 364/724.14, 825

[56] References Cited

U.S. PATENT DOCUMENTS

| 3,919,671 | 11/1975 | Fettweis et al. | 364/724.14 |
| 3,967,099 | 6/1976 | Fettweis | 364/724.14 |
| 4,192,008 | 3/1980 | Mandeville | 364/724.14 |

FOREIGN PATENT DOCUMENTS 0240820 10/1987 European Pat. Off. .
59-181813 10/1984 Japan .
59-207721 11/1984 Japan .

OTHER PUBLICATIONS

Brenner et al, "Analysis of Electric Circuits", copyright 1959 by McGraw-Hill Book Comp., Inc. p. 242.
Lawson, "Wave digital filter hardware structure", IEEE Proc., vol. 128, Pt. G, No. 6, Dec. 1981, pp. 307-312.
Denshi Joho Tsushin Gakkai Ronbunshi, Mar., 1987, vol. J70-A No. 3, pp. 491-499, "A Synthesis of Low--Sensitivity Digital Filters Using T-cascade Connection".
Denshi Joho Tsushin Gakkai Ronbunshi, Jun. 1986, vol. J69-A, No. 6, pp. 723-730, "On Equivalent Transformations and Sensitivity of Wave Digital Filters".

Primary Examiner—Tan V. Mai
Attorney, Agent, or Firm—Staas & Halsey

[57] ABSTRACT

A balancing network of a wave digital type filter including 3-port pair transforming adaptors (21 to 26) connected in cascade each having a capacitor (C) and a resistor (R) as constituent elements and performing a filter operation function. There is no reflected wave from each port pair other than the two port pairs for the cascade connection of the transforming adaptors (22, 24, 26) each including resistor (R), that port pair is eliminated, and adjoining transforming adaptors (21, 23, 25) each including capacitor (C) are combined to form new 3-port pair combined transforming adaptors (41). Thus, it becomes possible to realize a filter operation by a lesser amount of operations than the sum of the amounts of operations by the 3-port pair transforming adaptors (21 to 26).

12 Claims, 18 Drawing Sheets

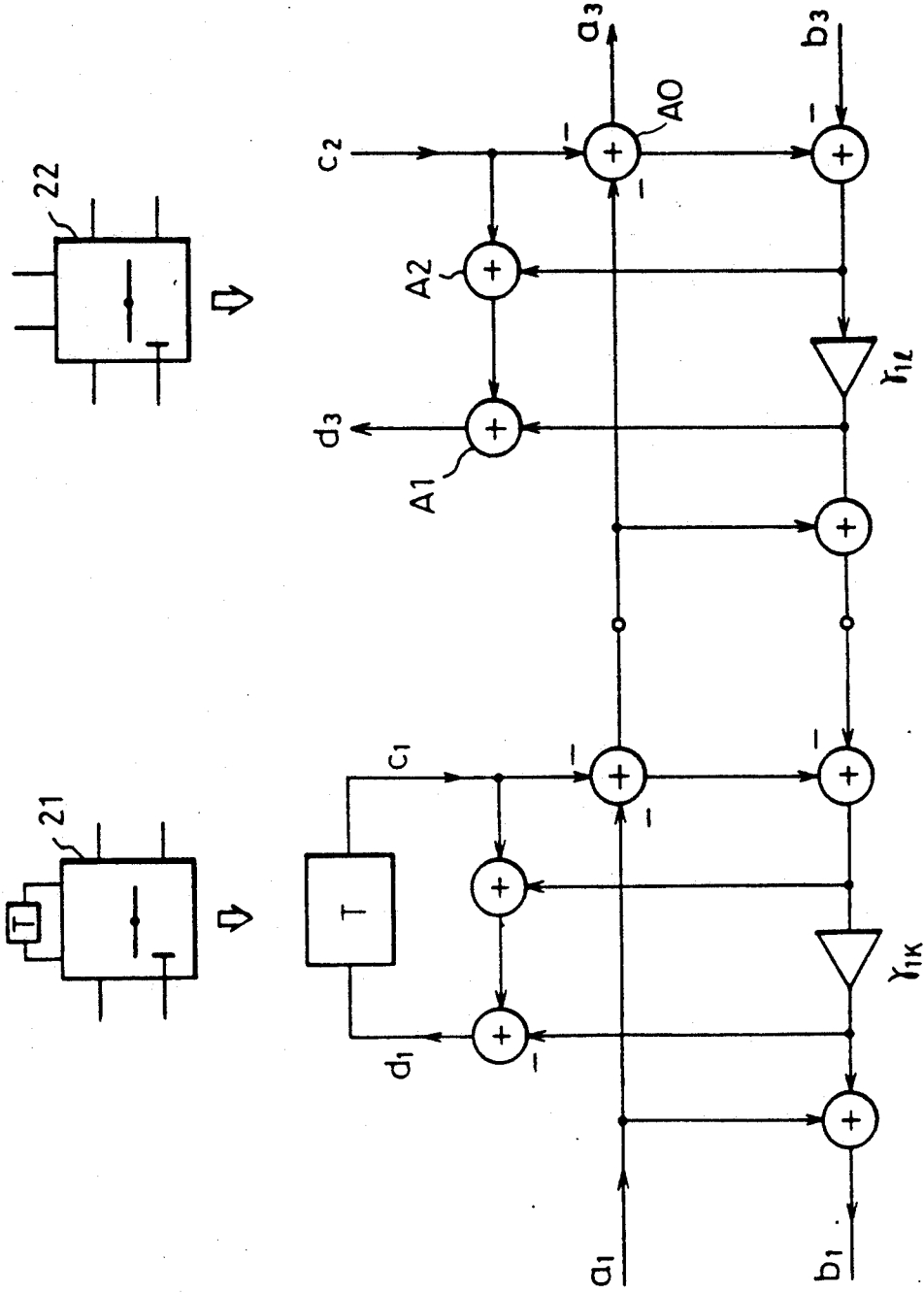

LIST OF REFERENCE NUMERALS

11... balancing network
14... hybrid transformer
31, 32... transforming adaptors
41... combined transforming adaptor
41', 41"... sectional combined transforming adaptors
A1, A2... adding means
M1, M2... multiplying means

TRANSFORMING ADAPTORS FOR WAVE DIGITAL FILTER AND BALANCING NETWORK USING SAME

BACKGROUND OF THE INVENTION

1. Field of the Invention

The present invention relates to transforming adaptors which are comprised of series and parallel circuits including a plurality of capacitors and a plurality of resistors which perform filter operation functions and a balancing network using wave digital filters which are include the transforming adaptors connected in cascade.

2. Description of the Related Art

It is advantageous to use wave digital filters when realizing balancing networks required in two-wire transmission systems for digital signals. This is because, compared with a general digital filter (represented by a cascade connection of an elementary digital filter section and expressed by a second order z function at the numerator and denominator) the correspondence with the balancing network made by passive elements in the analog domain is good and the requisite amount of memory may be reduced. Further, it is easy to obtain a reflected wave at an input terminal of the circuit, required as the output of the balancing network.

The method of designing a digital type balancing network using a wave digital filter is known. The present invention, however, proposes an improvement of the operating method of construction and an improvement of the characteristics.

As explained in more detail later, a wave digital filter type balancing network has various merits over a general digital filter, but suffers from the problem of a greater amount of filter operations per each basic sampling clock and therefore the size of the hardware becomes larger.

SUMMARY OF THE INVENTION

The present invention, in view of the above-mentioned problems with the prior art, has as its object the provision of a wave digital filter type balancing network which can reduce the amount of operations per basic sampling clock.

To achieve the above-mentioned object of the present invention, a wave digital filter is provided which comprises individual transforming adaptors, resistors, combined with respectively adjoining transforming adaptors to form a plurality of combined transforming adaptors and connecting the plurality of combined transforming adaptors in cascade. This enables a reduction of the amount of filter operations.

BRIEF DESCRIPTION OF THE DRAWINGS

The present invention will be explained below with reference to the appended drawings, wherein

FIGS. 14A, 14B, 14C, and 14D are wiring diagrams showing the procedure for forming a combined transforming adaptor 41 of the present invention by combining the transforming adaptors 21 and 22 (first stage) of FIG. 3;

DESCRIPTION OF THE PREFERRED EMBODIMENT

Figure 1:
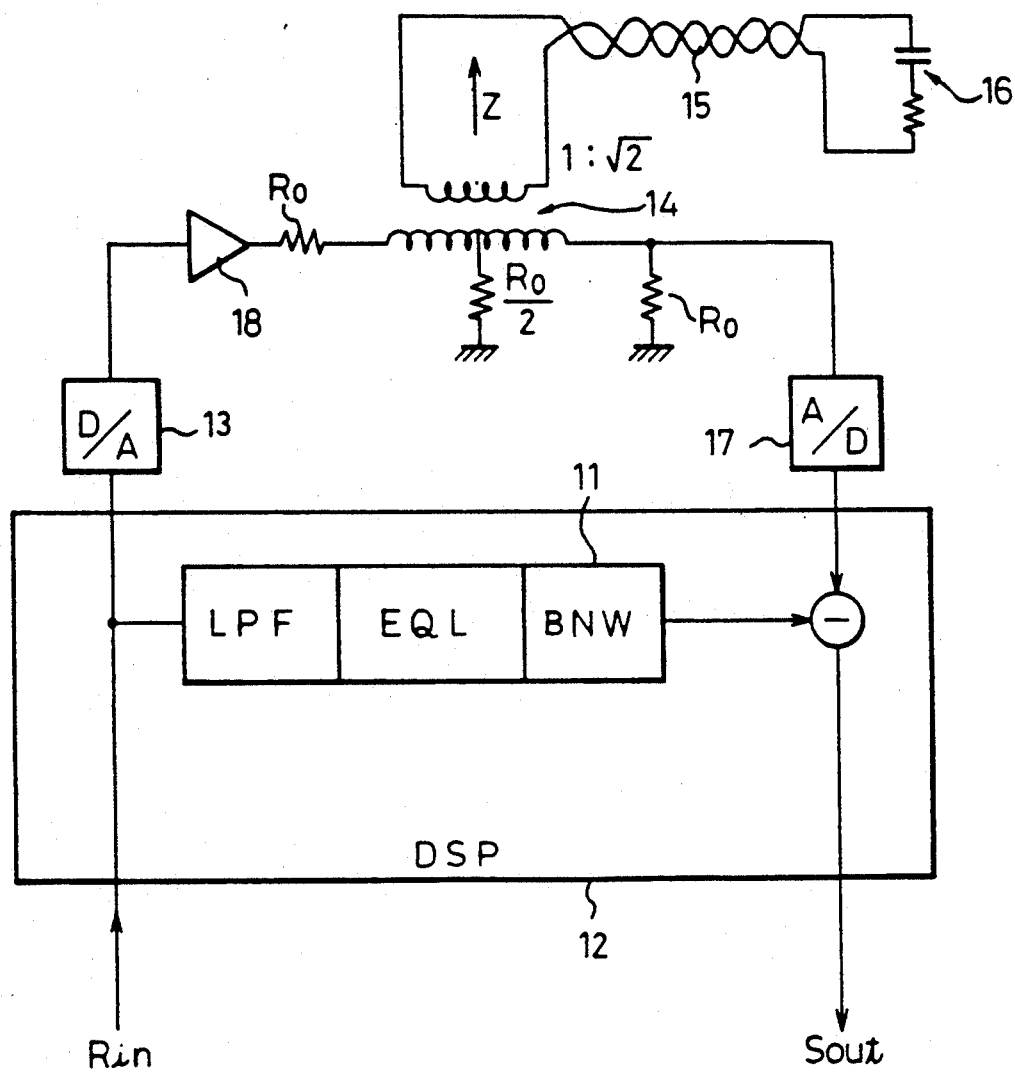
FIG. 1 is a block circuit diagram of a balancing network.

FIG. 1 is a block circuit diagram for explaining a balancing network. The present invention is applied to a balancing network (BNW) 11 in FIG. 1.

A digital signal from another terminal office (not shown) is input to a digital signal processing circuit 12 as a signal $R_{in}$ at the bottom left of the figure. In the processing circuit 12, a level setting is achieved, the frequency characteristics of the cable loss are equalized, and the signal is converted to an analog signal by a D/A converter of a PCM.CODEC (CODER-DECODER). The analog signal is transferred through a hybrid transformer 14 and 2-wire pair cable 15 to reach a subscriber terminating circuit 16. On the other hand, a signal from the subscriber 16 is transferred through the same pair cable 15 to enter the hybrid transformer 14, is converted to a digital signal by an A/D converter 17 of the PCM.CODEC of the right side in the FIG. 1 is again input to the digital signal processing circuit (DSP) 12, where it is adjusted in level, equalized in frequency characteristics of the cable loss, and is sent out to the other terminal office as the signal $S_{out}$.

Here, there is no problem if the impedance of the cable side viewed from the hybrid transformer 14 is the characteristic impedance $R_0$ of the circuit. Generally, however, the impedance Z differs according to the type and length of the cable, so the signal from the other terminal office heading to the subscriber is transferred to the A/D converter 17 through the hybrid transformer 14. The transfer characteristic H (equal to the input voltage of the A/D converter 17 when the output voltage of an amplifier 18 of the output side of the D/A converter 13 is 1) is given by the following equation:

$$H = (Z - R_0)/(4(Z + R_0))$$

For this, at the digital signal processing circuit 12, the signal from the other terminal office is transferred through a balancing network 11 having the same amplitude and phase characteristics as the above equation so as to produce a pseudo transfer signal which is subtracted from the signal from the A/D converter 17. That is, the function of an echo canceler is performed. A low pass filter (LPF) of FIG. 1 is required for creating interpolation data when the balancing network 11 must be operated with an over sampling clock. Further, the equalizer (EQL) is for compensating the transfer characteristic changes depending on the amplitude and phase characteristics of the low pass filters attached to the D/A and A/D converters 13 and 17 in addition to H of the above equation. The balancing network required in a two-wire type transmission system may be replaced, in terms of an equivalent circuit, with a serial and parallel type circuit comprised of resistors and capacitors. Therefore, it is advantageous to use a wave digital filter having operational units corresponding to those elements when realizing the circuit by digital signals. The problem of wave digital filters, however, is that the number of operations is more than double those of conventional types of digital filters.

In a wave digital filter, as was stated, there is good correspondence with a balancing network comprised of passive elements in the analog domain. In a wave digital filter when the upper limit of the frequency band region for which balancing is required becomes close to ½ of the frequency of the sampling clock, however, the correspondence deteriorates. Therefore, it is necessary to increase the frequency of the sampling clock of the wave digital filter and set the upper limit of the signal frequency band region to, for example, no more than ¼ of the frequency of the sampling clock. Viewing this based on the upper limit frequency of the signal, the frequency of the sampling clock becomes not 2 times greater but a higher multiple. This is referred to as over sampling. When the frequency of the sampling clock of the wave digital filter is made greater than the sampling clock having the frequency (n.fs) (which is n times higher than the frequency (fs) of the basic sampling clock), the amount of filter operations increases n fold.

In a wave digital filter and a balancing network using a wave digital filter in this way, a large amount of operations becomes a problem. This problem is explained in more detail below.

Referring again to FIG. 1, in the case of PCM transmission by a two-wire system between a subscriber and a terminal office, use is made of the above-mentioned balancing network (BNW) 11 to reduce the transfer of the signal from the reception side ($R_{in}$) to the transmission side ($S_{out}$) arising due to mismatching between the pair cable 15 and a terminating impedance. In this case, in the circuit for the balancing network 11, use is made of a so-called analog ladder type circuit (CR ladder type circuit) which is usually equal to the equivalent circuit of the pair cable including the terminating impedance.

Figure 2:
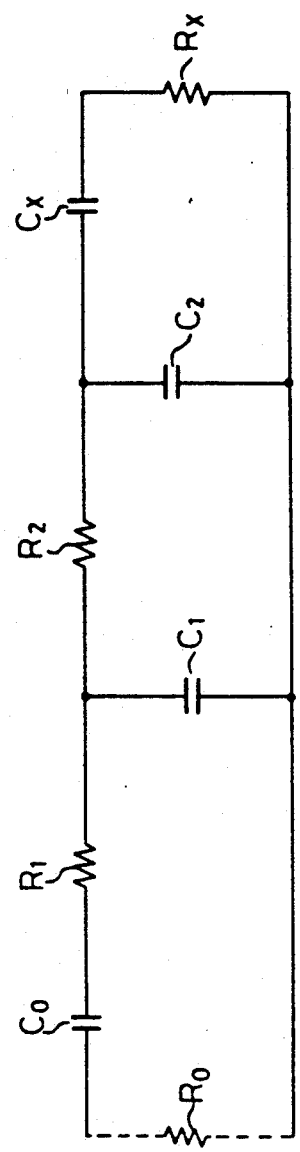
FIG. 2 is a circuit diagram of a general analog ladder type balancing network.

FIG. 2 is a circuit diagram of a general analog ladder type balancing network. For example, in the case of a pair cable often used in the U.S., etc., with a length of less than 12 kilofeet (kft), sufficiently good characteristics can be obtained by using four capacitors and three resistors as in this analog ladder type balancing network. Here, $C_0$ and $C_x$ are DC cutoff capacitors in the terminating impedance and $R_x$ is a resistor in the terminating impedance. Therefore, if the impedance level of the circuit in the figure is matched to the impedance level of the actual line, then $C_0 = C_x = 2.16 \ \mu F$ and $R_x$ becomes 600 Ω or 900 Ω. Note that the portions of $R_1$, $R_2$, $C_1$, and $C_2$ in the figure are equivalent elements of the pair cable itself and differ in value depending on the type and length of the pair cable.

On the actual line, there are two cases where the terminating resistor is 600 Ω or 900 Ω, as mentioned above. Further, there are cases where the DC cutoff capacitor is 2.16 μF and cases where it is a larger capacitance (for example, 33 μF), i.e., considered to be substantially short-circuited in the signal frequency band. Therefore, a balancing network with a separate cable portion and terminating circuits at the two ends as shown in FIG. 2 does not require storing the values of the elements of the equivalent circuit after matching each and every one of the cables, cable lengths, terminating conditions, etc. This enables a great reduction in the required capacity of the memory. The present invention is based on a balancing network with a separate cable portion and terminating circuits at the two ends as shown in FIG. 2.

Figure 3:
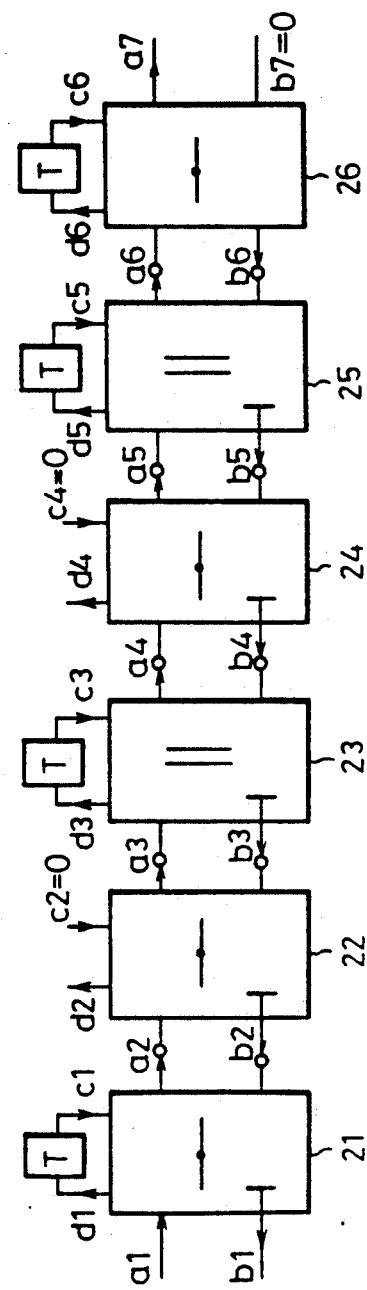
FIG. 3 is a block diagram of a general wave digital filter type balancing network.

FIG. 3 is a block circuit diagram of a general wave digital filter type balancing network.

When the circuit of FIG. 2 is transformed into a wave digital filter, transforming adaptors 21 to 26 make the transformation for all of the elements (resistors and capacitors) and the result of the transformation becomes as shown in FIG. 3. The transforming adaptors 21 to 26 perform the function of filter operations. The amount of operations becomes as indicated by the "wave filter theory" described in the latter part of this specification. Generally speaking, operations of three equations, i.e., three multiplication and addition operations, are required. Therefore, an average of nine (3×3) multiplication and addition operations and three data storage processing operations become required per element. Almost all transforming adaptors are simplified such that the equation (A-4) stands as in the later mentioned "wave digital theory", so the number of multiplication and addition operations becomes an average of eight. In general, when an operation of a digital filter is performed by a general purpose digital signal processing LSI (DSP), one step is normally required for a multiplication and addition operation and another step is required for storing the data. When the balancing network has a circuit construction as in FIG. 2, there are six elements (the final element $R_x$ is not counted), so the total number operations becomes 11 (8+3) ×6=66.

Further, the transmission frequency band region of signals for usual PCM transmission circuits is 0.3 to 3.4 kHz and the frequency of the basic sampling clocks is 8 kHz. In this case, the upper limit of the signal band region is 3.4 kHz and the ratio with the frequency of the sampling clock is 0.425, close to 0.5. Therefore, parameters giving good characteristics for the wave digital filter cannot be obtained. Thus, the frequency of the sampling clock of the wave digital filter is made to be 16 kHz, twice the frequency of the basic sampling clock (an over sampling). If doubled in this way, the amount of operations required per basic sampling clocks doubles. Thus, the amount of processing of the wave digital filter type balancing network using the circuit of FIG. 2, as a prototype circuit, becomes 132 operation steps, a large amount. Here, "prototype" has the meaning of "reference". The balancing network using the circuit of FIG. 2 as a prototype circuit is shown in FIG. 3.

The amount of operations of the wave digital filter type balancing network required per basic sampling clock generally becomes large 11.n (m−1), where m denotes the number of elements and n is (frequency of the oversampling clock)/(frequency of basic sampling clock). Therefore serious problems arise due to an increase in the size of the hardware.

The method of designing a wave digital filter is explained in detail in Alfred Fettweis, "Wave Digital Filters: Theory and Practice", Proceedings of the IEEE, Vol. 74, No. 2, February 1986. Here the focus will be placed on wave digital filter type balancing networks using the circuit of FIG. 2 as a prototype circuit. The method of design and operation of the same will be described again to clarify the above problem.

As mentioned above, FIG. 3 is a wave digital filter using FIG. 2 as a prototype circuit. In the two figures, the 3-port pair transforming adaptors shown by the square blocks are made to correspond with the elements except for the resistor $R_x$ at the right side. Explaining the port pairs using the transforming adaptor 21 at the left side as an example, a1 shows the incoming wave from the left side circuit and b1 the reflected wave going to the left side circuit. Further, a2 is the reflected wave going to the right side circuit (the incoming wave for the second transforming adaptor 22 from the left, so named a2) and b2 the incoming wave from the right side circuit (reflected wave for the second adaptor 22, so named b2). Further, d1 is the output wave going to the element corresponding to the left side transforming adaptor 21 (in this case $C_0$ of FIG. 2), and c1 is the reflected wave from the element. There are two types of transforming adaptors (21, 22, 24, and 26 and 23 and 25), one of which corresponds to the series elements and the other of which corresponds to the parallel elements. In the case of series elements and in the case of parallel elements, the relational equations between the ports differ as explained in the later mentioned "wave filter theory".

Here, $a_k$ and $b_k$ (k is 1, 2, 3 ...) are signals physically on the same port pair. The signals are separated into incoming waves (a) and reflected waves (b) using a relationship similar to the later mentioned (A-10) as a function of the port impedances of the port pairs.

The port impedances of the port pairs connected to the elements (resistors R and capacitors C) are identified as follows according to the type of the element:
in the case of a capacitor: $T/(2.C)$
in the case of a resistor: R (1)

Here, T is the basic sampling period of the wave digital filter. This T corresponds to the T in FIG. 3 and is a delay for a charging time (T) of the capacitors.

The port impedances of the port pairs connecting one transforming adaptor to another transforming adaptor can be set arbitrarily. To simplify the actual filter operations, in a general wave digital filter, the port impedance $RT_2$ of the right side port pair in the series 3-port pair transforming adaptors 21, 22, and 24 is set to become the sum of the port impedance $RT_1$ of the left side port pair and the port impedance $RT_3$ of the top port pair (see $RT_2 = RT_1 + RT_3$, shown in the later mentioned equation (A-3)) so that the later mentioned equation (A-4) stands.

Similarly, in the case of the parallel 3-port pair transforming adaptors 23 and 25, the port conductance, which is the inverse of the port impedance, is set to satisfy the relationship of the later mentioned equation (A-8).

The port impedance of the left side port pair of the left side adapter 21 must be made the characteristic impedance $R_0$ of the hybrid transistor 14 as later explained.

Using the above relationships, if the port impedances among the transforming adaptors of FIG. 3 are made, from the left, $RP_1$, $RP_2$, $RP_3$, ... $RP_5$, the values of the same become as follows:

$$RP_1 = R_0 + T/(2.C_0) \tag{2}$$

$$RP_2 = RP_1 + R_1 \tag{3}$$

$$RP_3 = RP_2.[T/C_1/2]/[RP_2 + T/C_1/2] \tag{4}$$

$$RP_4 = RP_3 + R_2 \tag{5}$$

$$RP_5 = RP_4.[T/C_2/2]/[RP_4 + T/C_2/2] \tag{6}$$

Using these port impedances, the filter coefficients $\gamma_{mm'}$ of the transforming adaptors become as follows:

Note that the m in the term $\gamma_{mm'}$ indicates the three ports (1, 2, and 3) and the m' in the term $\gamma_{mm'}$ indicates the six adaptors (1, 2, 3 ... 6).

$$\gamma 11 = R_0/RP_1, \gamma 21 = 1, \gamma 31 = 1 - \gamma 11 \tag{7}$$

$$\gamma 12 = RP_1/RP_2, \gamma 22 = 1, \gamma 32 = 1 - \gamma 12 \tag{8}$$

$$\gamma 13 = RP_3/RP_2, \gamma 23 = 1, \gamma 33 = 1 - \gamma 13 \tag{9}$$

$$\gamma 14 = RP_3/RP_4, \gamma 24 = 1, \gamma 34 = 1 - \gamma 14 \tag{10}$$

$$\gamma 15 = RP_5/RP_4, \gamma 25 = 1, \gamma 35 = 1 - \gamma 15 \tag{11}$$

$$\gamma 16 = 2.RP_5/RP, \gamma 26 = 2.R_x/RP, \gamma 36 = T/C_x/RP \tag{12}$$

where $RP = RP_5 + R_x + T/C_x/2$

On the other hand, the following relationship, determined by the type of the element, exists for the incoming wave $d_{m'}$ to the element and the reflected wave $c_{m'}$ from the element:

In the case of a capacitor, $$c(t) = d(t - T) \text{ (where t is the time)} \tag{13}$$

In the case of a resistor $$c(t) = 0 \tag{14}$$

(Note: the resistor elements themselves consume power and emit heat and do not produce reflected waves.)

If these filter coefficients and relationships are inserted into the equation of the 3-port pair transforming adaptors given in the later mentioned "wave filter theory", the following 15 equations (equation (15) to equation (29)) stand:

$$b1(t) = (1 - \gamma 11)a1(t) - \gamma 11.b2(t) - \gamma 11.d1(t - T) \tag{15}$$

$$a2(t) = -a1(t) - d1(t - T) \tag{16}$$

$$d1(t) = -(1 - \gamma 11)a1(t) - (1 - \gamma 11)b2(t) - \gamma 11.d1(t - T) \tag{17}$$

$$b2(t) = (1 - \gamma 12)a2(t) - \gamma 12.b3(t) \tag{18}$$

$$a3(t) = -a2(t) \tag{19}$$

$$b3(t) = (\gamma 13 - 1)a3(t) + b4(t) + (1 - \gamma r13)d3(t - T) \quad (20)$$

$$a4(t) = \gamma 13.a3(t) + (1 - \gamma 13)d3(t - T) \quad (21)$$

$$d3(t) = \gamma 13.a3(t) + b4(t) - -\gamma 13.d3(t - T) \quad (22)$$

$$b4(t) = (1 - \gamma 14)a4(t) - \gamma 14.b5(t) \quad (23)$$

$$a5(t) = -a4(t) \quad (24)$$

$$b5(t) = (\gamma 15 - 1)a5(t) + b6(t) + (1 - \gamma 15)d5(t - T) \quad (25)$$

$$a6(t) = \gamma 15.a5(t) + (1 - \gamma 15)d5(t - T) \quad (26)$$

$$d5(t) = \gamma 15.a5(t) + b6(t) - -\gamma 15.d5(t - T) \quad (27)$$

$$b6(t) = (1 - \gamma 16)a6(t) - \gamma 16.d6(t - T) \quad (28)$$

$$d6(t) = -\gamma 36.a6(t) + (1 - \gamma 36)d6(t - T) \quad (29)$$

In the above equations (15) to (29), the relationship of the incoming wave and reflected wave (above equation (13)) relating to the capacitors, that is, $c1(t) = d1(t-T)$, $c3(t) = d3(t-T)$, $c5(t) = d5(t-T)$, $c6(t) = d6(t-T)$, is used to eliminate $c_m'(t)$. Further, the equation of the reflected wave (above equation (14)) relating to resistors, that is, $c2(t) = 0$, $c4(t) = 0$, $b7(t) = 0$, is inserted in the equations.

These 15 equations (15) to (29) are recurrence equations relating to discrete time data. The data $b1(t)$ at the time t is calculated as follows: first, the input data is $a1(t)$. The data $d1(t-T)$, $d3(t-T)$, $d5(t-T)$, and $d6(t-T)$ are outputs of the top ports of the transforming adaptors appearing one sampling clock before and are known values. Therefore, $a(3)t$ is determined from the above equations (16) and (19). Then, $a5(t)$ is determined from the equations (21) and (24). Further, $a6(t)$ is obtained from equation (26). The terms $a6(t)$ and $d6(t-T)$ is used to find $b6(t)$ and $d6(t)$ from equations (28) and (29). The term $d6(t)$ is used for the calculation at the next sampling time, that is, $t+T$. Next, $b6(t)$ and the already known $a5(t)$ and $d5(t-T)$ are used to calculate $b5(t)$ and $d5(t)$ from equations (25) and (27).

Next, $b4(t)$ is calculated from equation (23) and $b3(t)$ and $d3(t)$ are calculated from equations (20) and (22).

Then, $b2(t)$ is calculated from equation (18) and $b1(t)$ and $d1(t)$ are calculated from equations (15) and (17).

The $b1(t)$ found in this way is the value at the time t of the reflected wave sought and is calculated with respect to successive inputs $a1(t)$ at the times $t+T$, $t+2T$ ...

Consider the processing using the general purpose digital signal processing LSI (DSP). In this DSP, in general the multiplication and addition operation of $A \times B + D \rightarrow D$ is processed in one cycle. Processing of addition alone also requires one cycle. Further, the load processing of data from the memory can be performed in parallel with the operation except with the initial first and second operations. It is impossible, however, to perform the processing for results in the memory in parallel and another processing cycle becomes necessary.

In the processing of the above equations (15) to (29), 34 multiplication and addition operations and 15 storage processings are required, for a total of 49 (34+15) cycles. The 49 operation steps per six elements is less than the 66 operation steps mentioned earlier. This is because if the resistor elements are included, the special condition of the reflected wave=0 (above equation (14)) is added.

If the frequency of the sampling clock of the balancing network is made n times the frequency of the basic sampling clock, then 49 cycles become necessary per one basic sampling clock, which can still be said to be a large size. Usually, n=2 is sufficient in a balancing network of a PCM transmission line, so if n = 2, the number of cycles necessary for processing the balancing network becomes 98 and an average 16 cycles are necessary per element. n is the ratio mentioned earlier, that is, (the frequency of the oversampling clock)/(the frequency of the basic sampling clock). When the usual digital filter is operated with an oversampling of n=2, then a second order, or about 2.5 times the number of cycles, is required compared with just the 12 cycles per two elements.

As explained in detail above, a wave digital filter type balancing network has the above-mentioned merits compared with a general digital filter, but has the problem of a greater amount of filter operations per basic sampling clock and therefore the hardware becomes larger in size.

Figure 4:
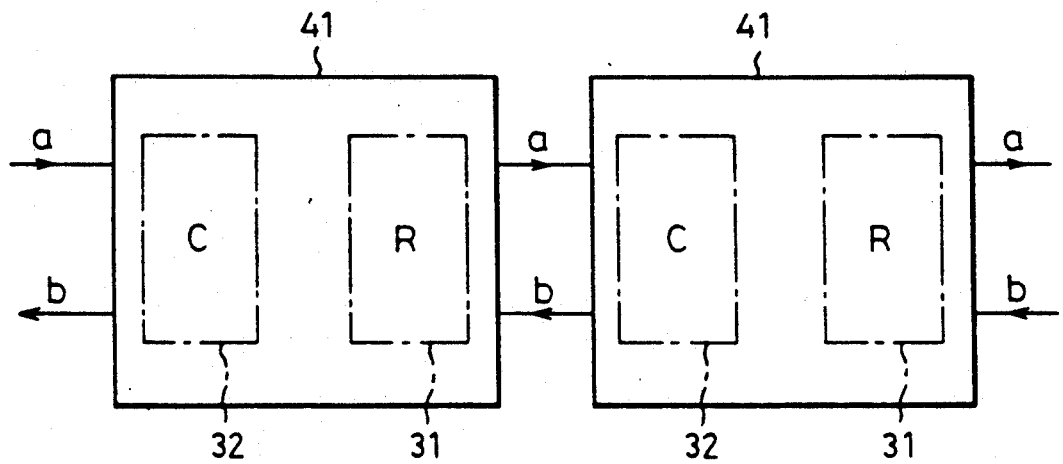
FIG. 4 is a block diagram of a first wave digital filter type balancing network according to the present invention.

FIG. 4 is a block diagram of a first wave digital filter type balancing network according to the present invention. Among the plurality of transforming adaptors 31 and 32 (21 to 26 in FIG. 3), the transforming adaptors 31 (22, 24, 26) corresponding to the resistors R ($R_1$, $R_2$, etc.) are combined with the adjoining transforming adaptors 32 (21, 23, 25) to form a plurality of combined transforming adaptors 41. These combined transforming adaptors 41 are connected in cascade to form a balancing network. Note that a and b are the above-mentioned incoming wave and reflected wave, respectively.

Figure 5:
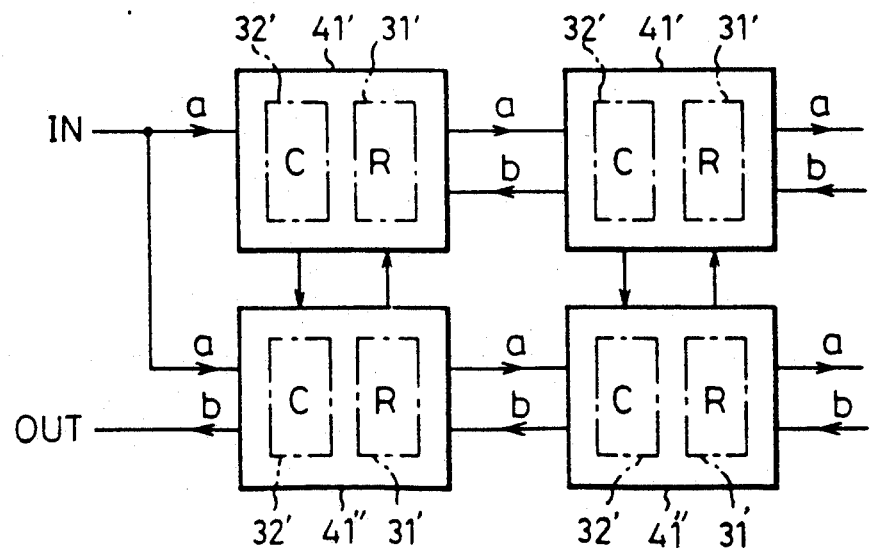
FIG. 5 is a block diagram of a second wave digital filter type balancing network according to the present invention.

FIG. 5 is a block diagram of a second wave digital filter type balancing network according to the present invention. In FIG. 5, the wave digital filter type balancing network is operated by an oversampling clock ($CK_n$) having a frequency n times (n being an integer of 2 or more) the basic sampling clock (CK). A discrete filter output (OUT) is obtained for each basic sampling clock (CK). The filter operations in the basic sampling clocks (CK) are divided into n times by making each of the plurality of combined transforming adaptors 41 n times a number of sectional combined transforming adaptors 41' and 41" and making the values of the filter coefficients differ among the sectional combined transforming adaptors 41' and 41".

The functions of the above first and second wave digital filter type balancing networks are as follows.

The first wave digital filter type balancing network (FIG. 4) takes note of the fact that there is no reflected wave from the resistor elements (R) (see above-mentioned equation (14)) and eliminates the ports. Along with elimination of the ports, the adjoining adaptors are combined to form the single transforming adaptors 41. This leads to a reduction in the number of operations.

The second wave digital filter type balancing network (FIG. 5) uses the oversampling operation to enable a plurality of transforming adaptors with different filter coefficients to be used in one basic sampling clock (CK). By dividing the filter processing into a first half and a second half and changing the filter coefficient, it is fully conceivable that a balancing network with a higher precision could be obtained. If, however, both the processing results of the first half and the second half are used, in general the operation would be performed as a time variable filter. Therefore, so the problem would arise of a different frequency component being induced. Here, however, only one of the results, either of the first half or second half, is used, so this problem does not occur and it is possible to improve the precision of the balancing network.

(1) First Wave Digital Filter Type Balancing Network

Figure 6:
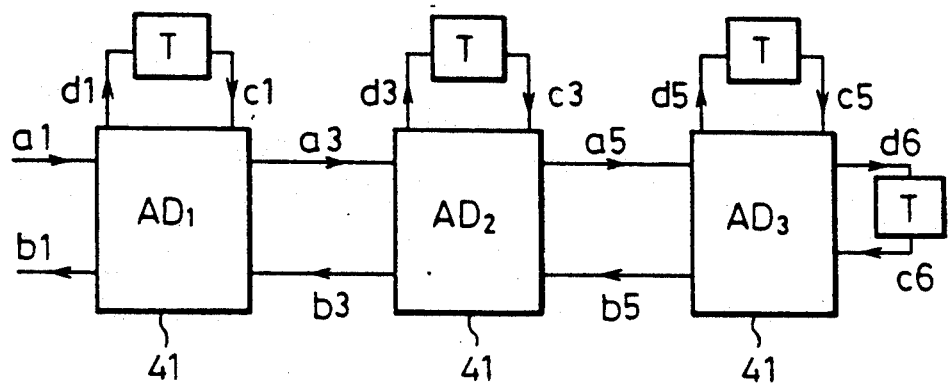
FIG. 6 is a block diagram of a first embodiment of the first wave digital filter type balancing network according to the present invention.
Figure 7:
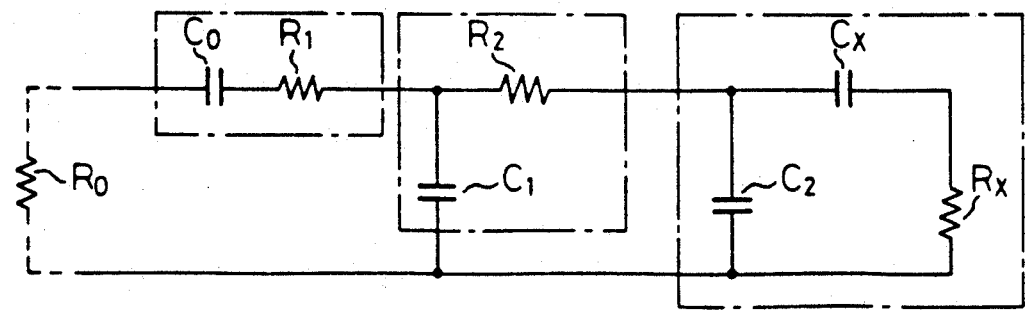
FIG. 7 is a circuit diagram of a first prototype analog ladder type balancing network.

FIG. 6 is a view of a first embodiment of the first wave digital filter type balancing network, and FIG. 7 is a circuit diagram of a prototype analog ladder type balancing network. The circuit of FIG. 7 is exactly the same as the above-mentioned circuit of FIG. 2, but the elements forming the transforming adaptors are at least two elements each as shown by the dot-chain line (in the past one transforming adaptor corresponded to one element). Therefore, in FIG. 6, the number of transforming adaptors is reduced from the conventional six to three. The first combined transforming adaptor 41 ($AD_1$) is a combination of the first and second transforming adaptors 21 and 22 counted from the left in the conventional wave digital filter (FIG. 3). The second combined transforming adaptor 41 ($AD_2$) is a combination of the third and fourth transforming adaptors 23 and 24 of the conventional filter. The third combined transforming adaptor 41 ($AD_3$) is a combination of the fifth and sixth transforming adaptors 25 and 26 of the conventional filter.

A point in the combination is that a resistor is connected to one of the ports of one of the adaptors among the original two transforming adaptors. Even in the sixth transforming adaptor 26 of the conventional wave digital filter, the top port is connected to a capacitor, but a resistor is connected to the right port. In this case, there are three port pairs for each new combined transforming adaptor 41. The relationship among these port pairs differs from the conventional series adaptor and parallel adaptor, but the number of operations does not increase. The incoming waves a1, a3, a5, d1, d3, d5, and d6 and the reflected waves c1, c3, c5, and c6 are the same as in the case of FIG. 3.

The relationship among these can be derived by eliminating a2, b2, a4, b4, a6, and b6 from the equations (15) to (29). The results are shown by the following equations:

$$b1(t)=(1-\gamma 11.\gamma 12)a1(t)+\gamma 11.\gamma 12.b3(t) \\ -\gamma 11.\gamma 12.d1(t-T) \quad (30)$$

$$a3(t)=a1(t)+d1(t-T) \quad (31)$$

$$d1(t)=-\gamma 12(1-\gamma 11)a1(t)+\gamma 12(1-\gamma 11)b3(t) \\ +\{1-\gamma 12(1-\gamma 11)\}d1(t-T) \quad (32)$$

$$b3(t)=[(2-\gamma 14)\gamma 13-1]a3(t)-\gamma 14.b5(t) \\ +(1-\gamma 13)(2-\gamma 14)d3(t-T) \quad (33)$$

$$a5(t)=-\gamma 13.a3(t)-(1-\gamma 13)d3(t-T) \quad (34)$$

$$d3(t)=\gamma 13(2-\gamma 14)a3(t)-\gamma 14.b5(t)+\{(1-\gamma r13)(2- \\ -\gamma 14)-1\}d3(t-T) \quad (35)$$

$$b5(t)=\{\gamma 15(2-\gamma 16)-1\}a5(t)+(1-\gamma 15)(2-\gamma 16)d5- \\ (t-T)-\gamma 16.d6(t-T) \quad (36)$$

$$d5(t)=\gamma 15(2-\gamma 16)a5(t)+\{(1-\gamma 15)(2-\gamma 16)-1\}d- \\ 5(t-T)-\gamma 16.d6(t-T) \quad (37)$$

$$d6(t)=\gamma 15.\gamma 36.a5(t)-(1-\gamma 15)\gamma 36.d5(t-T) \\ +(1-\gamma 36)d6(t-T) \quad (38)$$

The nine equations (30) to (38) may be solved in the same way as the above-mentioned equations (15) to (29). If the coefficients of the equations relating to the filter coefficients $\gamma_{mm'}$ are calculated in advance, the nine equations (30) to (38) can be calculated by 25 multiplication and addition operations and nine storage processings. Therefore, the necessary number of cycles becomes 34. Looking at this by number per basic sampling clock (CK), we get 68, which is 30 smaller than in the prior art. This means a reduction of the total number of operations to about $\frac{2}{3}$.

(II) Second Wave Digital Filter Type Balancing Network

Figure 8:
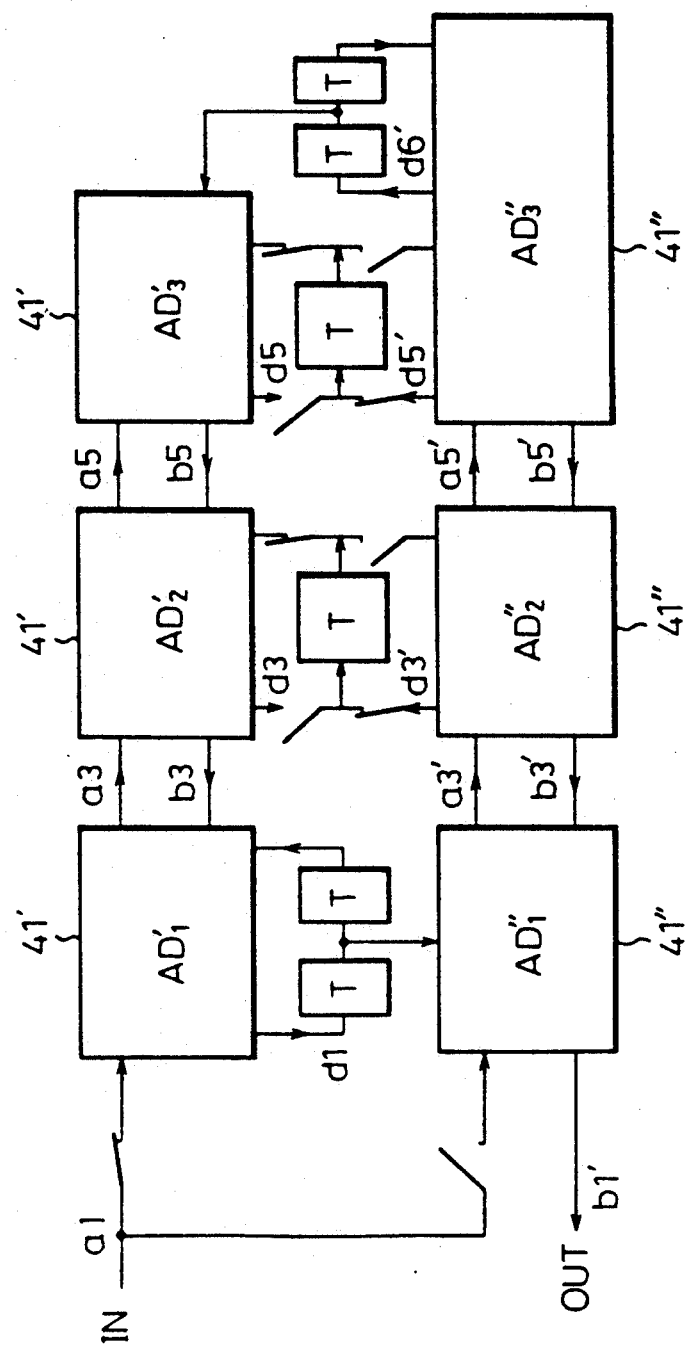
FIG. 8 is a block diagram of a second embodiment of a second wave digital filter type balancing network.
Figure 9:
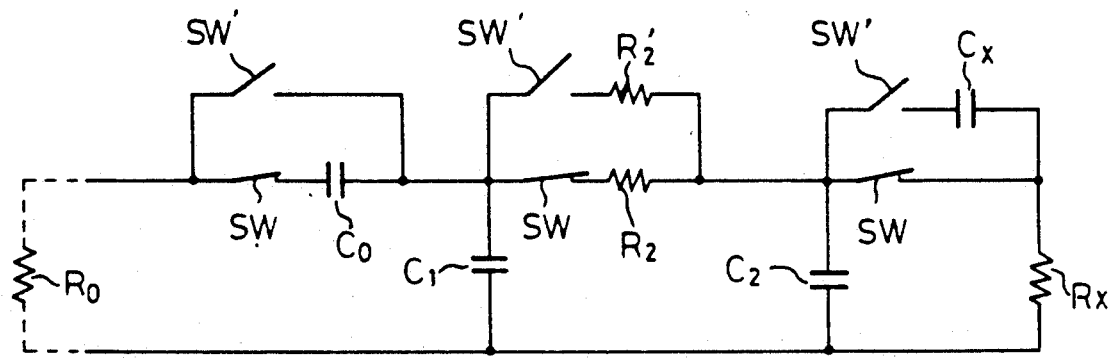
FIG. 9 is a circuit diagram of a second prototype analog ladder type balancing network.

FIG. 8 is a view of an embodiment of the second wave digital filter type balancing network. FIG. 9 is a circuit diagram of a prototype analog ladder type balancing network. In FIG. 8, if use is made of an oversampling clock having a frequency, for example, two times the basic sampling clock (CK), the filter operation in FIG. 6 is divided into two. Therefore, each of the individual combined transforming adaptors 41 in FIG. 6 is comprised of two times a number of sectional combined transforming adaptors 41' and 41''. This is exactly the same as the first, second, and third combined adaptors ($AD_1$, $AD_2$, and $AD_3$) shown in FIG. 6.

This second aspect of the present invention assumes a wave digital filter type balancing network which operates at the frequency of the oversampling clock ($CK_n$). As mentioned earlier, the explanation will be made assuming that the value of the ratio, i.e., (frequency of the oversampling clock ($CK_n$))/(the frequency of the basic sampling clock (CK)), is n=2. In this case, filter operations of the equations (30) to (38) are performed divided into 2 (n=2) in the basic sampling clock (CK), where the first in the two is called the first half processing and the second the second half processing. The point in the second aspect is that the output b1(t) of the wave digital filter operating at the frequency of the oversampling clock ($CK_n$) can be obtained twice per one basic sampling clock (CK), in the first half processing and the second half processing. Note is taken of the fact that in actuality only one is used and the circuit configuration of the prototype analog ladder type circuit and the value of the elements are changed between the first half processing and second half processing. In general, if the filter coefficients are changed in the middle of processing in a digital filter, the result is a time variable filter, so the transfer characteristics between the input and output become nonlinear. In a digital filter operating at a frequency of the oversampling clock ($CK_n$), however, when the output is given only once in the basic sampling clock (CK), there is no change in the filter coefficient when viewed between intervals of the basic sampling clock, linearity between outputs is maintained, and the output is guaranteed. Note that the guarantee of the output mentioned here means that when a signal of a specific frequency is input to the input, only the component of the same frequency is produced at the output.

A specific example will be explained by the prototype circuit of FIG. 9. First, among the terminating elements, the DC cutoff capacitors $C_0$ and $C_x$ are short-circuited at one of the first half processing and second half processing. The capacitance in FIG. 7 had been $C_0 = C_x = 2.16$ μF, but here use is made of a capacitance half of that, 1.08 μF. The switches SW and SW' of FIG. 9 shows the complementary switching of the on/off state in the first half processing and the second half processing. For example, if the state in the figure is the state in the first half processing, then in the second half processing the switch SW which is on in FIG. 9 becomes off and the switch SW' which is off becomes on. This being the case, the capacitor $C_0$, which is a definite value (capacitance of $C_0$) in the first half processing, is short-circuited in the second half processing. Further, the capacitor $C_x$, which is a definite value (capacitance of $C_x$) in the second half processing is short-circuited in the first half processing. As to why such a change is allowed, the capacitors $C_0$ and $C_x$ are large capacitances of 2.16 $\mu$F. Thus, near the upper limit frequency of the signal, close to $\frac{1}{2}$ the basic sampling clock frequency, a state sufficiently close to a short-circuit is entered. Inherently there is no need for this portion to operate at the oversampling clock frequency. If it is set so that a capacitance of 2.16 $\mu$F exists at the processing of one of the first half processing or second half processing, then the equivalent function as of a circuit with 2.16 $\mu$F may be obtained at both the first and second half processings.

Next, an explanation will be given regarding the reduction of the amount of operations in the ladder type circuit portion comprised of $C_1$, $C_2$, $R_1$, and $R_2$, the equivalent circuit portion of the cable in FIG. 7. In FIG. 9, the resistor $R_1$ which had been present in FIG. 7 disappears. In the prototype circuit of FIG. 7, the case where $R_1$ has to be made a value other than zero is limited to a case where the distance is considerably long and use is made of types of cables with large loss per unit length. At other times, result is obtained even if $R_1$ is equal to zero. Therefore, in the present invention, as shown in FIG. 9, by making $R=0$, the number of operations is reduced. The deterioration in the precision of the equivalent circuit, which becomes a problem when the cable distance is long, is compensated for here by changing the value of the resistor $R_2$ between the first half processing ($R_2$) and second half processing ($R'_2$). If the parameters (filter coefficients) are changed between the first half processing and second half processing, naturally there is a possibility of obtaining a better precision equivalent circuit, but the specific degree of improvement, i.e., how much an improvement can be obtained by what degree of change, cannot be determined without actual simulation. On the other hand, it is necessary to hold in the memory the values of the parameters (filter coefficients) corresponding to various cable types and cable lengths. From the viewpoint of reducing the amount of memory, it is best to make the number of elements where the values are changed between the first half processing and second half processing as few as possible. In the embodiment shown in FIG. 9, only the resistor $R_2$ is changed in value between the first half and second half.

Let us look at what the equations for the basic sampling clock (CK) become at this time. First, assume that all the parameters change between the first half processing and second half processing in general and that the parameter in the equation is $\gamma_{mm'}$ in the first half and $\beta_{mm'}$ in the second half. Note that when $R_1=0$, $\gamma 12 = \beta 12 = 1$ is obtained due to the above-mentioned equations (3) and (8).

First, the necessary equations will be listed and then the explanation made.

$$\begin{bmatrix} b1(t) \\ a3(t) \\ d1(t) \end{bmatrix} = \begin{bmatrix} 1 - \gamma 11, & \gamma 11, & -\gamma 11 \\ 1, & 0, & 1 \\ -(1 - \gamma 11), & 1 - \gamma 11, & \gamma 11 \end{bmatrix} \begin{bmatrix} a1(t) \\ b3(t) \\ d1'(t - T) \end{bmatrix} \quad \begin{matrix} (39) \\ (40) \\ (41) \end{matrix}$$

$$\begin{bmatrix} b3(t) \\ a5(t) \\ d3(t) \end{bmatrix} = \begin{bmatrix} (2 - \gamma 14)\gamma 13 - 1, & -\gamma 14, & (1 - \gamma 13)(2 - \gamma 14) \\ -\gamma 13, & 0, & -(1 - \gamma 13) \\ \gamma 13(2 - \beta 14), & -\gamma 14, & (1 - \gamma 13)(2 - \gamma 14) - 1 \end{bmatrix} \begin{bmatrix} a3(t) \\ b5(t) \\ d3'(t - T) \end{bmatrix} \quad \begin{matrix} (42) \\ (43) \\ (44) \end{matrix}$$

$$\begin{bmatrix} b5(t) \\ d5(t) \\ d6(t) \end{bmatrix} = \begin{bmatrix} \gamma 15(2 - \gamma 16) - 1, & (1 - \gamma 15)(2 - \gamma 16), & -\gamma 16 \\ \gamma 15(2 - \gamma 16), & (1 - \gamma 15)(2 - \gamma 16) - 1, & -\gamma 16 \\ -\gamma 15 \cdot \gamma 36, & -(1 - \gamma 15)\gamma 36, & 1 - \gamma 36 \end{bmatrix} \begin{bmatrix} a5(t) \\ d5'(t - T) \\ d6'(t - T) \end{bmatrix} \quad \begin{matrix} (45) \\ (46) \\ (47) \end{matrix}$$

$$\begin{bmatrix} b1'(t + T) \\ a3'(t + T) \\ d1'(t + T) \end{bmatrix} = \begin{bmatrix} (1 - \beta 11), & +\beta 11, & -\beta 11 \\ 1 & 0, & 1 \\ -(1 - \beta 11), & +(1 - \beta 11), & +\beta 11 \end{bmatrix} \begin{bmatrix} a1(t + T) \\ b3'(t + T) \\ d1(t) \end{bmatrix} \quad \begin{matrix} (48) \\ (49) \\ (50) \end{matrix}$$

$$\begin{bmatrix} b3'(t + T) \\ a5'(t + T) \\ d3'(t + T) \end{bmatrix} = \begin{bmatrix} (2 - \beta 14)\beta 13 - 1, & -\beta 14, & (1 - \beta 13)(2 - \beta 14) \\ \beta 13, & 0, & -(1 - \beta 13) \\ \beta 13(2 - \beta 14), & -\beta 14, & (1 - \beta 13)(2 - \beta 14) - 1 \end{bmatrix} \begin{bmatrix} a3'(t + T) \\ b5'(t + T) \\ d3'(t) \end{bmatrix} \quad \begin{matrix} (51) \\ (52) \\ (53) \end{matrix}$$

$$\begin{bmatrix} b5'(t + T) \\ d5'(t + T) \\ d6'(t + T) \end{bmatrix} = \begin{bmatrix} \beta 15(2 - \beta 16) - 1, & (1 - \beta 15)(2 - \beta 16), & -\beta 16 \\ \beta 15(2 - \beta 16), & (1 - \beta 15)(2 - \beta 16) - 1, & -\beta 16 \\ -\beta 15 \cdot \beta 36, & -(1 - \beta 15)\beta 36, & 1 - \beta 36 \end{bmatrix} \begin{bmatrix} a5'(t + T) \\ d5(t) \\ d6(t) \end{bmatrix} \quad \begin{matrix} (54) \\ (55) \\ (56) \end{matrix}$$

In the above equations, the equations (39) to (47) are relational equations at the time t. The input value a1(t) and the d1'(t−T), d3'(t−T), d5'(t−T), d6'(t−T) already obtained as results of the operations at the time (t−T), are considered known, and equation having $\gamma_{mm'}$ as a parameter is solved, and b1(t), d1(t), d3(t), d5(t), d6(t), are found. Next, these values d1(t) to d6(t) and the input at the time t+T, that is, a1(t+T) are combined and the equations (48) to (56) having $\beta_{mm'}$ as a parameter are used to find b1'(t+T), d1'(t+T), d3'(t+T), d5'(t+T), d6'(t+T). The results d1'(t+T) to d6'(t+T) are used as data for the first half processing at the next sampling period.

The above was the series of filter operations in the basic sampling clock (CK) when changing the parameters between the first half processing and second half processing, where the output b1'(t) or b1(t) are the reflected waves sought. Which one of b1'(t) or b1(t) to use will be discussed later, but whatever the case only one is used. The calculation of either the equation (39) or the equation (48) is unnecessary. If b1'(t) is used, the calculation of the equation (39) becomes unnecessary.

Here, if, in the first half processing, $C_x$ is infinitely large, and, in the second half processing, $C_0$ is infinitely large, then the following equations stand by the already mentioned equations (2), (7), and (12):

$$\gamma 36 = 0 \tag{57}$$

$$\beta 11 = 1 \tag{58}$$

If equation (57) is substituted into equation (47), then $$d6(t) = d6'(t-T) \tag{59}$$

Similarly, if the equation (58) is substituted into the equation (50), then $$d1'(t+T) = d1(t) \tag{60}$$

Note that if the same memories are allocated for the d6 and d6' and the d1 and d1', the processings can be performed automatically and the calculation becomes simpler.

If the above is reflected into the already mentioned equations (39) to (56), the following equations stand:

$$\begin{bmatrix} a3(t) \\ d1(t) \end{bmatrix} = \begin{bmatrix} 1, & 0, & 1 \\ -(1-\gamma 11), & 1-\gamma 11, & \gamma 11 \end{bmatrix} \begin{bmatrix} a1(t) \\ b3(t) \\ d1(t-2T) \end{bmatrix} \quad (61), (62)$$

$$\begin{bmatrix} b3(t) \\ a5(t) \\ d3(t) \end{bmatrix} = \begin{bmatrix} (2-\gamma 14)\gamma 13 - 1, & -\gamma 14, & (1-\gamma 13)(2-\gamma 14) \\ -\gamma 13, & 0, & -(1-\gamma 13) \\ \gamma 13(2-\beta 14), & -\gamma 14, & (1-\gamma 13)(2-\gamma 14) - 1 \end{bmatrix} \begin{bmatrix} a3(t) \\ b5(t) \\ d3'(t-T) \end{bmatrix} \quad (63), (64), (65)$$

$$\begin{bmatrix} b5(t) \\ d5(t) \end{bmatrix} = \begin{bmatrix} \gamma 15(2-\gamma 16) - 1, & (1-\gamma 15)(2-\gamma 16), & -\gamma 16 \\ \gamma 15(2-\gamma 16), & (1-\gamma 15)(2-\gamma 16) - 1, & -\gamma 16 \end{bmatrix} \begin{bmatrix} a5(t) \\ d5'(t-T) \\ d6'(t-T) \end{bmatrix} \quad (66), (67)$$

$$\begin{bmatrix} b1(t-T) \\ a3'(t-T) \end{bmatrix} = \begin{bmatrix} 0, & 1, & -1 \\ 1, & 0, & 1 \end{bmatrix} \begin{bmatrix} a1(t-T) \\ b3'(t-T) \\ d1(t) \end{bmatrix} \quad (68), (69)$$

$$\begin{bmatrix} b3'(t+T) \\ a5'(t+T) \\ d3'(t+T) \end{bmatrix} = \begin{bmatrix} (2-\beta 14)\beta 13 - 1, & -\beta 14, & (1-\beta 13)(2-\beta 14) \\ -\beta 13, & 0, & -(1-\beta 13) \\ \beta 13(2-\beta 14), & -\beta 14, & (1-\beta 13)(2-\beta 14) - 1 \end{bmatrix} \begin{bmatrix} a3'(t+T) \\ b5'(t+T) \\ d3(t) \end{bmatrix} \quad (70), (71), (72)$$

$$\begin{bmatrix} b5'(t+T) \\ d5'(t+T) \\ d6'(t+T) \end{bmatrix} = \begin{bmatrix} \beta 15(2-\beta 16) - 1, & (1-\beta 15)(2-\beta 16), & -\beta 16 \\ \beta 15(2-\beta 16), & (1-\beta 15)(2-\beta 16) - 1, & -\beta 16 \\ -\beta 15 \cdot \beta 36, & -(1-\beta 15)\beta 36, & 1-\beta 36 \end{bmatrix} \begin{bmatrix} a5'(t+T) \\ d5(t) \\ d6(t) \end{bmatrix} \quad (73), (74), (75)$$

The wave digital filter type balancing network processed by these equations is as shown in FIG. 8. The sectional combined transforming adaptors AD'$_1$, AD'$_2$, and AD'$_3$ perform the processing of the equations (61) to (67), while the sectional combined transforming adaptors AD''$_1$, AD''$_2$, and AD''$_3$ perform the processing of equations (68) to (75). The on/off states of the switches SW and SW' correspond to FIG. 9. As already mentioned, the switches in this figure are in the state of the first half processing. The results d1'(t) and d6(t) are not calculated. Instead, use is made of d1(t) and d6'(t), so the operations required for the d1'(t) and d6(t) in the past can be eliminated.

The number of steps required for calculation of the equations (61) to (75) is 41 for the multiplication and addition operations and 15 for the storage processing for a total of 56 (per one basic sampling clock). If this is compared with the case of the first wave digital filter type balancing network mentioned above (first aspect of the invention), the first aspect of the invention required 68 steps per basic sampling clock. This figure, however, was the figure for the case of calculating b1(t) twice in a basic sampling clock. In actuality, the calculation of one b1(t) in the first half processing or the second half processing is unnecessary. If this amount is subtracted, then the total becomes 64 (per one basic sampling clock) in the case of the first aspect of the invention. Therefore, if the second wave digital filter type balancing network (second aspect of the invention) is applied, eight steps per basic sampling clock can be reduced compared with the first aspect of the invention.

Note that the problem remains of how to find the values of the parameters in the case of changing the parameters between the first half and second half of the basic sampling clock by a digital filter operated at the frequency of the oversampling clock, that is, the values of the elements in FIG. 9.

In regard to this, the equations in the frequency domain using a z $(=\exp(j2\pi fT)f$: frequency) parameter, corresponding to equations (61) to (75), may be established. If Al(f), A3(f) ... are made the stationary solutions for al(t), a3(t) ..., the following equations stand.

$$\begin{bmatrix} B1(f) \\ A3(f) \\ D1(f) \end{bmatrix} = \begin{bmatrix} 1-\gamma 11, & \gamma 11, & 1-\gamma 11 \\ 1, & 0, & 1 \\ -(1-\gamma 11), & 1-\gamma 11, & \gamma 11 \end{bmatrix} \begin{bmatrix} A1(f) \\ B3(f) \\ Z^{-2} \cdot D1(f) \end{bmatrix} \qquad (76) (77) (78)$$

$$\begin{bmatrix} B3(f) \\ A5(f) \\ D3(f) \end{bmatrix} = \begin{bmatrix} (2-\gamma 14)\gamma 13 - 1, & \gamma 14, & (1-\gamma 13)(2-\gamma 14) \\ -\gamma 13, & 0, & -(1-\gamma 13) \\ \gamma 13(2-\beta 14), & -\gamma 14, & (1-\gamma 13)(2-\gamma 14)-1 \end{bmatrix} \begin{bmatrix} A3(f) \\ B5(f) \\ Z^{-1} \cdot D3'(f) \end{bmatrix} \qquad (79) (80) (81)$$

$$\begin{bmatrix} B5(f) \\ D5(f) \end{bmatrix} = \begin{bmatrix} \gamma 15(2-\gamma 16) - 1, & (1-\gamma 15)(2-\gamma 16), & -\gamma 16 \\ \gamma 15(2-\gamma 16), & (1-\gamma 15)(2-\gamma 16)-1, & -\gamma 16 \end{bmatrix} \begin{bmatrix} A5(f) \\ Z^{-1} \cdot D5'(f) \\ Z^{-1} \cdot D6'(f) \end{bmatrix} \qquad (82) (83)$$

$$\begin{bmatrix} Z \cdot B1'(f) \\ Z \cdot A3'(f) \end{bmatrix} = \begin{bmatrix} 0, & 1, & -1, \\ 1, & 0, & 1 \end{bmatrix} \begin{bmatrix} Z \cdot A1(f) \\ Z \cdot B3'(f) \\ D1(f) \end{bmatrix} \qquad (84) (85)$$

$$\begin{bmatrix} Z \cdot B3'(f) \\ Z \cdot A5'(f) \\ Z \cdot D3'(f) \end{bmatrix} = \begin{bmatrix} (2-\beta 14)\beta 13 - 1, & -\beta 14, & (1-\beta 13)(2-\beta 14) \\ -\beta 13, & 0, & -(1-\beta 13) \\ \beta 13(2-\beta 14), & -\beta 14, & (1-\beta 13)(2-\beta 14)-1 \end{bmatrix} \begin{bmatrix} Z \cdot A3'(f) \\ Z \cdot B5'(f) \\ D3(f) \end{bmatrix} \qquad (86) (87) (88)$$

$$\begin{bmatrix} Z \cdot B5'(f) \\ Z \cdot D5'(f) \\ Z \cdot D6'(f) \end{bmatrix} = \begin{bmatrix} \beta 15(2-\beta 16) - 1, & (1-\beta 15)(2-\beta 16), & -\beta 16 \\ \beta 15(2-\beta 16), & (1-\beta 15)(2-\beta 16)-1, & -\beta 16 \\ -\beta 15 \cdot \beta 36, & -(1-\beta 15)\beta 36, & 1-\beta 36 \end{bmatrix} \begin{bmatrix} Z \cdot A5'(f) \\ D5(f) \\ D6(f) \end{bmatrix} \qquad (89) (90) (91)$$

These equations become complex simultaneous equations. But, if the z corresponding to the frequency sought is substituted and the equation solved, then the stationary solutions B1(f), B1'(f) corresponding to b1(t) and b1'(t) are obtained. One of B1(f) and B1'(f) is made to become the frequency characteristics sought by optimizing the values of the elements of the prototype analog ladder type balancing network by the use of an optimization simulation program to find the values of the elements.

An example of the values of the elements found by the simulation is shown in the following table.

end in series with the pair cable 15 a DC cutoff capacitor of 2.16 μF, switching the characteristic impedance $R_0$ of the hybrid transistor 14 to 900 Ω or 600 Ω in accordance with the terminating resistance of the end of the pair cable, and enabling as much of a pass-through attenuation amount as possible to be obtained in both cases.

The upper row of the table shows the results of simulation in the case of $R_2 = R'_2$ (see FIG. 9) and the lower row shows the results in the case of $R_2$ and $R'_2$ as independent parameters. From these results, it will be understood that the characteristics are improved in the range from the low frequencies to medium frequencies.

Note that the pass-through attenuation amount in this table means the difference in the loss from the signal $R_{in}$ to the signal $S_{out}$ when the (cable + terminating circuit) are provided at the primary side of the hybrid transformer 14 in the circuit of FIG. 1 and the loss from $R_{in}$ to $S_{out}$ when the primary side is opened.

(III) "Wave Filter Theory"

TABLE 1

| Type and length of cable | Indicated value of prototype filter | | | | Pass-through attenuation (dB) | | | | | |
|---|---|---|---|---|---|---|---|---|---|---|
| | | | | | $R_0 = R_x = 900\Omega$ | | | $R_0 = R_x = 600\Omega$ | | |
| | $C_1$ (PF) | $R_2$ (Ω) | $C_2$ (PF) | $R'_2$ (Ω) | Low freq. | Med. freq. | High freq. | Low freq. | Med. freq. | High freq. |
| 24 gauge cable 12 kilofeet | 55600 | 509.4 | 172800 | 509.4 | 28.4 | 29.6 | 32.9 | 27.3 | 29.8 | 32.5 |
| | 43300 | 904.9 | 188800 | 418.0 | 30.1 | 32.2 | 31.9 | 29.0 | 32.8 | 34.7 |

(where, $C_0 = 1.08$ μF, $C_z = 1.08$ μF)

This table shows the results of optimization by terminating the end of a pair cable having a length of 12 kilofeet generally known as a 24 gauge cable with 900Ω + 2.16 μF or 600Ω + 2.16 μF, inserting at the near The basic equations of a series 3-port pair adaptor in the wave digital filter theory are expressed by the following equations:

$$\begin{aligned} b_k &= (1-\gamma_{1k})a_k - \gamma_{1k} \cdot b_{k+1} - \gamma_{1k} \cdot C_k \\ a_{k+1} &= -\gamma_{2k} \cdot a_k + (1-\gamma_{2k})b_{k+1} - \gamma_{2k} \cdot C_k \\ d_k &= -\gamma_{3k} \cdot a_k - \gamma_{3k} \cdot b_{k+1} + (1-\gamma_{3k})C_k \end{aligned} \quad (A\text{-}1)$$

Here, the incoming wave of the left port pair is made $a_k$, the reflected wave is made $b_k$, the incoming wave of the right port pair is made $b_{k+1}$, the reflected wave is made $a_{k+1}$, the incoming wave of the top port pair is made $c_k$, and the reflected wave is made $d_k$. Further, the port impedance of the left port pair is made $RT_1$, the port impedance of the right side is made $RT_2$, and the port impedance of the top port pair is made $RT_3$, whereupon $$\gamma_{mm'} = 2.RT_m/(RT_1 + RT_2 + RT_3) \quad m = 1 \text{ to } 3 \qquad (A\text{-}2)$$

If the port impedance of the right port pair of the adaptor is the sum of the port impedance of the left port pair and the port impedance of the port pair connected to the elements, that is, when the following stands:

$$RT_2 = RT_1 + RT_3 \qquad (A\text{-}3)$$

the following equation stands:

$$\gamma_{2k} = 1 \qquad (A\text{-}4)$$

and $$\gamma_{1k} + \gamma_{3k} = 1 \qquad (A\text{-}5)$$

Next, the fundamental equations of the parallel 3-port pair adaptor is expressed by the following equations:

$$\begin{aligned} b_k &= (\gamma_{1k} - 1)a_k + \gamma_{2k} \cdot b_{k+1} + \gamma_{3k} \cdot C_k \\ a_{k+1} &= \gamma_{1k} \cdot a_k + (\gamma_{2k} - 1)b_{k+1} + \gamma_{3k} \cdot C_k \\ d_k &= \gamma_{1k} \cdot a_k + \gamma_{2k} \cdot b_{k+1} + (\gamma_{3k} - 1)C_k \end{aligned} \quad (A\text{-}6)$$

The $\gamma_{mm'}$ in the above equation may be found from the following equation if the port conductances of the port pairs are made $GT_1$, $GT_2$, and $GT_3$:

$$\gamma_{mm'} = 2.GT_m/(GT_1 + GT_2 + GT_3) \quad m = 1 \text{ to } 3 \quad (A\text{-}7)$$

The port conductance is the inverse of the port impedance mentioned earlier, so if similar to the DC adaptor, $$GT_2 = GT_1 + GT_3 \qquad (A\text{-}8)$$

the above equations (A-4) and (A-5) stand.

The gist of a general digital balancing network is as explained in detail with reference to FIG. 1. If, however, the transfer characteristic from the incoming wave a1(t) of the left port to the reflected wave b1(t) in the wave digital filter type balancing network of FIG. 3 is calculated, if the port voltage and the port current of the left port are made V and I, respectively and the stationary values of a1, b1 (value in frequency domain) are made A1 and B1 (value in time domain), and the port impedance of the left port is $R_0$, the following relationships stand:

$$A1 = V + R_0.I, \quad B1 = V - R_0.I \qquad (A\text{-}9)$$

so $B1/A1 = (V - R_0.I)/(V + R_0.I)$

Here, the circuit of FIG. 2 is an equivalent circuit and the terminating impedance of the cable is equal to the impedance of the cable and the terminating circuit of FIG. 1 and the following equation stands:

$$V/I = Z \qquad (A\text{-}10)$$

If this is substituted in equation (A-9), then $$B1/A1 = (Z - R_0)/(Z + R_0) \qquad (A\text{-}11)$$

stands, which is four times the value of equation (A-9). Therefore, in the case of a wave digital filter type balancing network, it is sufficient if the signal is added to the incoming wave a1, the reflected wave b1 is multiplied by 0.25 ($\frac{1}{4}$), and the result is subtracted from the output of the A/D converter 17.

The above explanation was made based on numerical equations, but the invention cannot be easily understood with just numerical equations. Therefore, supplementary explanation will now be given using an image wiring diagram shown schematically.

Figure 10:
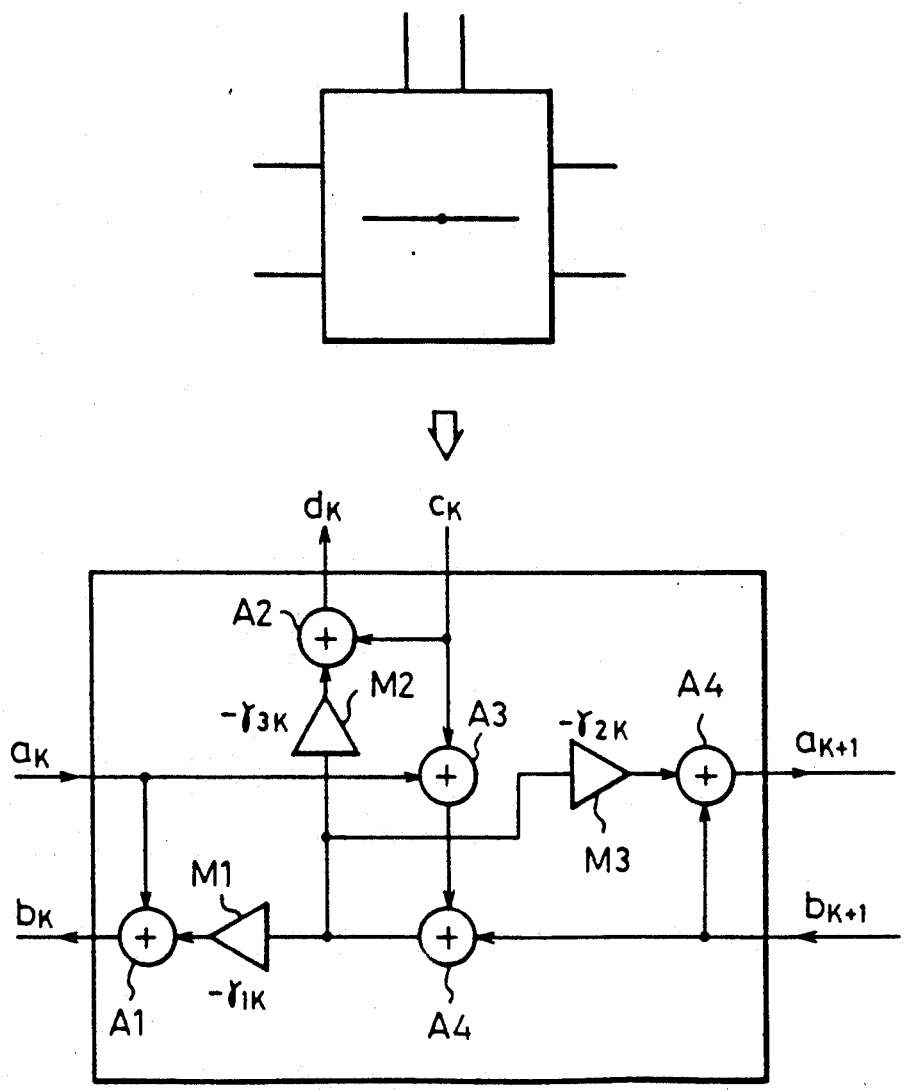
FIG. 10 is an equivalent wiring diagram showing a general format of a series 3-port pair adaptor.

FIG. 10 is an equivalent wiring diagram showing a general format of a series 3-port pair adaptor and each of the transforming adaptors 21, 22, 24, and 26 shown in FIG. 3. In the figure, $a_k$, $a_{k+1}$, $b_k$, $b_{k+1}$, $c_k$, $c_{k+1}$, $d_k$, $d_{k+1}$ (k = 1, 2, ...) correspond to $a_1$, $a_2$, ... $b_1$, $b_2$ ..., $c_1$, $c_2$ ..., $d_1$, $d_2$ ... Further, the circle +marks with the symbols A1, A2, etc., attached indicate the adding means and the triangles with the symbols M1, M2, etc., attached indicate the multiplying means. The same applies in the remaining drawings. Here, the adding means (A) and the multiplying means M) may be adders and multipliers made by hardware or may be addition operation processing and multiplication processing using software.

The equivalent wiring diagram of FIG. 10, if shown by a numerical equation, becomes similar to (A-1) in the "wave filter theory" of Section (III). This will be verified. Looking at $b_k$ in the first line in equation (A-1), $b_k$ in equation (A-1) is the $b_k$ in FIG. 10. The $b_k$ in FIG. 10 is the total of $a_k$ after the adding means A1 in the figure, $a_k (= -\gamma_{1k}.a_k)$ after the adding means A3, A4 and the multiplying means M1 and A1, $b_{k+1} (= -\gamma_{1k}.b_{k+1})$ after A4, M1, and A1, and $c_k (= -\gamma_{1k}.c_k)$ after A3, A4, M1, and A1, the result of which is $$a_k - \gamma_{1k}.a_k - \gamma_{1k}.b_{k+1} - \gamma_{1k}.c_k$$

This corresponds to the first line ($b_k$) in equation (A-1). The above procedure applies in the same way to the second line ($a_{k+1}$) and third line ($d_k$) in equation (A-1).

Figure 11:
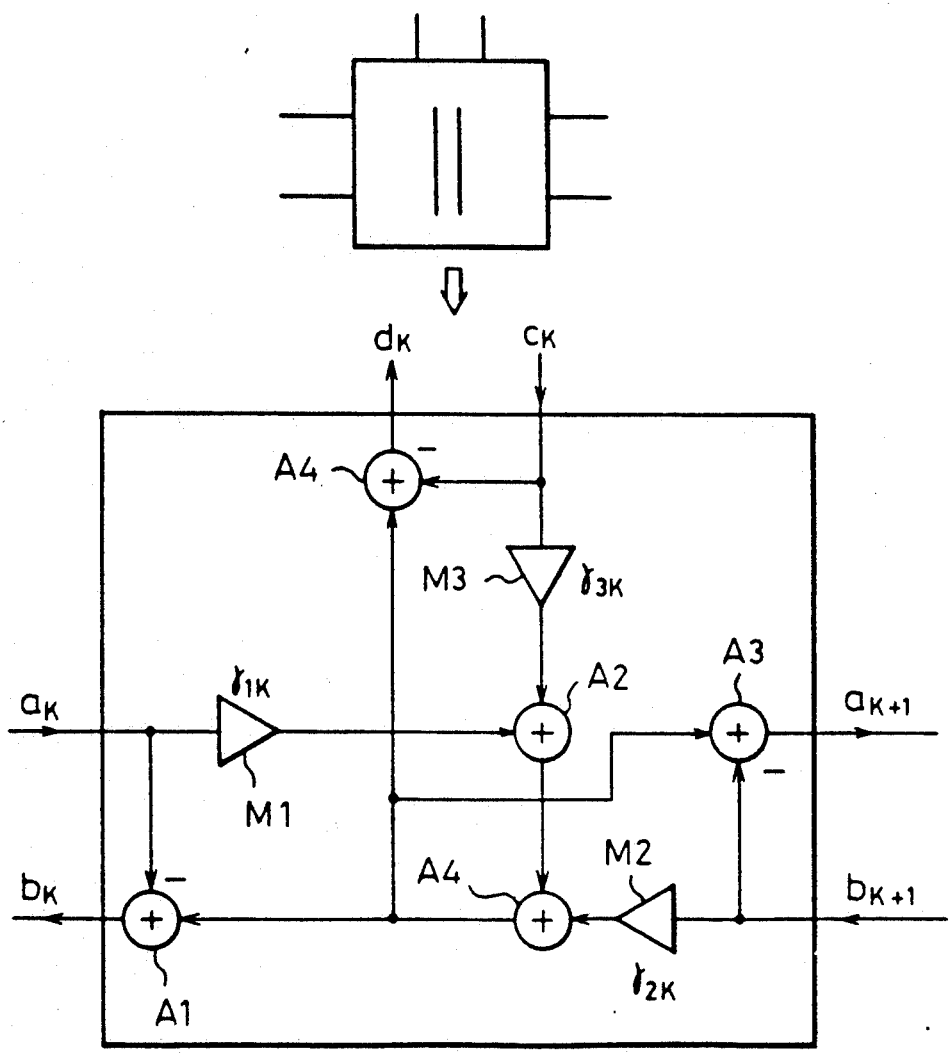
FIG. 11 is an equivalent wiring diagram showing a general format of a parallel 3-port pair adaptor.

FIG. 11 is an equivalent wiring diagram showing a general format of a parallel 3-port pair adaptor and each of the transforming adaptors 23 and 25 shown in FIG. 3.

The equivalent wiring diagram of FIG. 11, if shown by a numerical equation, becomes similar to (A-6) in the "wave filter theory" of Section (III). This will be verified. Looking at $b_k$ in the first line in equation (A-6), $b_k$ in equation (A-6) is the $b_k$ in FIG. 11. The $b_k$ in FIG. 11 is the total of the $a_k (= -a_k)$ after the minus port (−) of the adding means A1 in the figure, $a_k (= \gamma_{1k}.a_k)$ after the multiplying means M1 and the adding means A2, A4, and A1, $b_{k+1} (= -\gamma_{2k}.b_{k+1})$ after M2, A4, and A1, and $c_k (= -\gamma_{3k}.c_k)$ after M3, A2, A4, and A1, the result of which is $$-a_k + \gamma_{1k} \cdot a_k + \gamma_{2k} \cdot b_{k+1} + \gamma_{3k} \cdot c_k$$

This corresponds to the first line ($=b_k$) in the above equation (A-6).

Here, if the condition of the above-mentioned port impedance, that is, $$RT_2 = RT_1 + RT_3$$

is satisfied, then $$\gamma_{2k} = 1$$

$$\gamma_{1k} + \gamma_{3k} = 1$$

the wiring diagram mentioned earlier is simplified and further streamlined.

Figure 12:
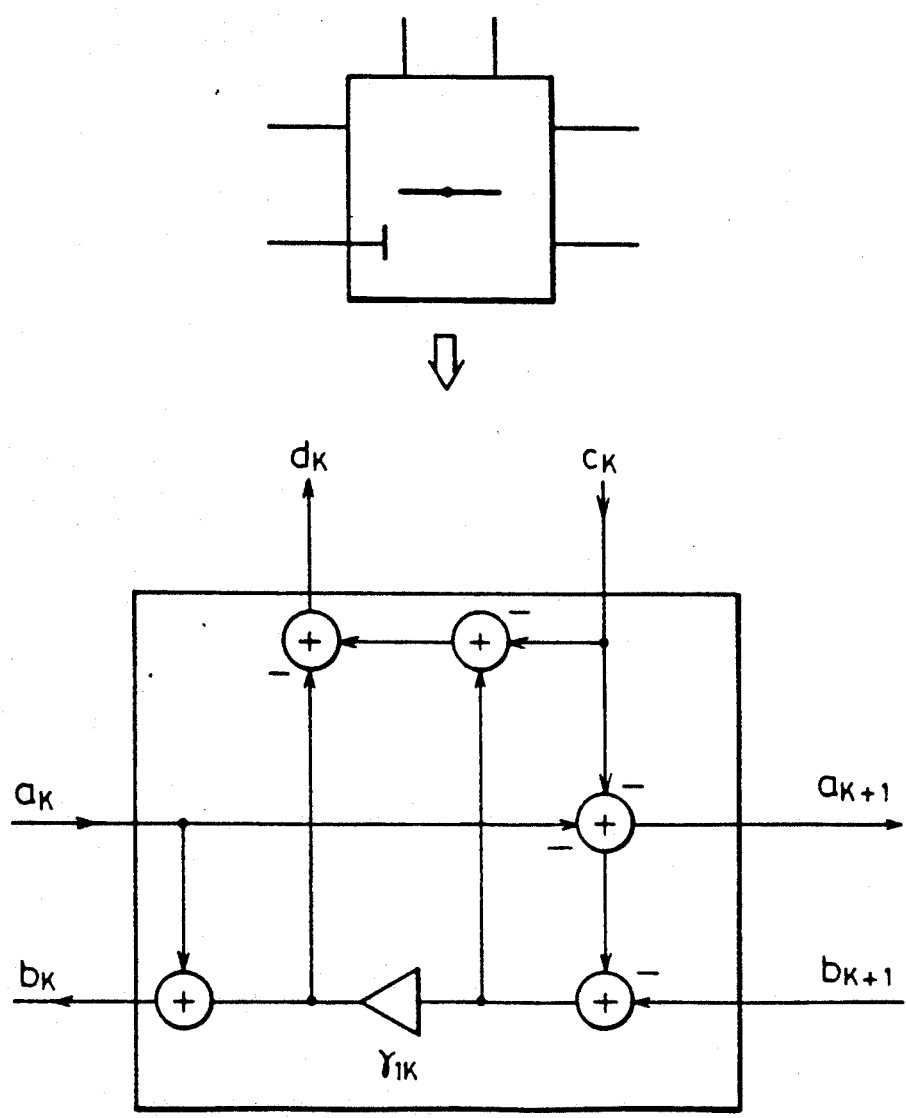
FIG. 12 is an equivalent wiring diagram showing a simplified format of a series 3-port pair adaptor.

FIG. 12 is an equivalent wiring diagram showing a simplified format of a series 3-port pair adaptor and is a simplified version of the wiring diagram of FIG. 10. In FIG. 11, the three multipliers shown in FIG. 10 are made one (only $\gamma_{1k}$). This applies also to the parallel 3-port pair adaptor.

Figure 13:
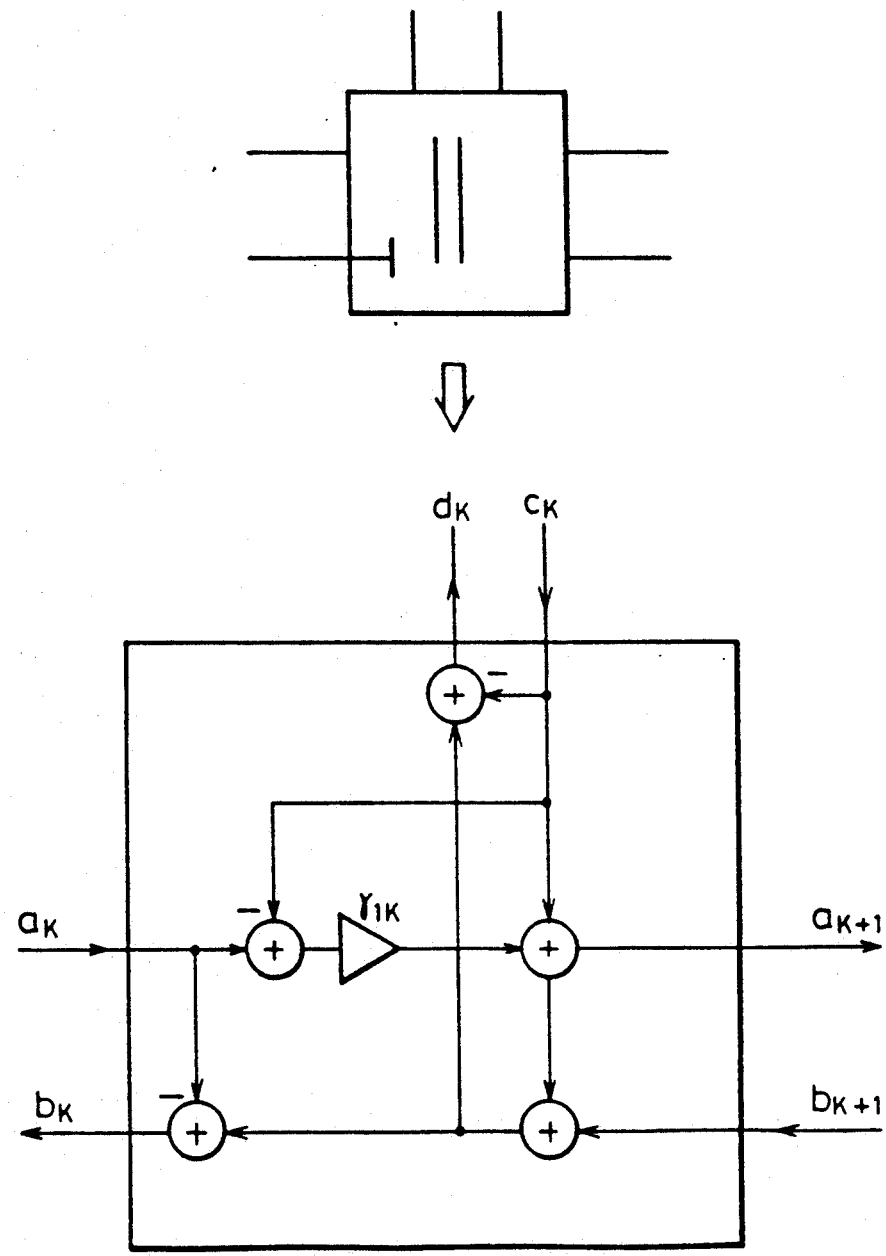
FIG. 13 is an equivalent wiring diagram showing a simplified format of a parallel 3-port pair adaptor.

FIG. 13 is an equivalent wiring diagram showing a simplified format of a parallel 3-port pair adaptor and is a simplified version of the wiring diagram of FIG. 11. In FIG. 13, the three multipliers shown in FIG. 11 are made one (only $\gamma_{1k}$).

Using mainly the simplified transforming adaptors shown in FIG. 12 and FIG. 13, the combined transforming adaptor 41 of FIG. 4 is formed.

Expressing the transforming adaptors 21, 22, 23, 24, 25, and 26 of FIG. 3 by numerical equations based on the simplified wiring diagrams shown in FIG. 12 and FIG. 13, the above-mentioned equations (15) to (29) are obtained. The corresponding relationship is as follows. The left shows the reference numerals of the transforming adaptors and the right the numbers of the equations.

| Transforming adaptor | Numerical equation |
| --- | --- |
| 21 | (15), (16), (17) |
| 22 | (18), (19) |
| 23 | (20), (21), (22) |
| 24 | (23), (24) |
| 25 | (25), (26), (27) |
| 26 | (28), (29) |

The transforming adaptor 22 has no output $d_2$, so only two numerical equations are given. The same applies to the transforming adaptor 24.

Further, the transforming adaptor 26 does not use the output $a_7$, therefore only two numerical equations are given.

Next, considering the case of the present invention, the present invention mainly uses the simplified transforming adaptors shown in FIG. 12 and FIG. 13 to form the combined transforming adaptor 41 of FIG. 4. The procedure of its formation is shown below.

FIGS. 14A, 14B, 14C, and 14D are views showing the procedure for forming a combined transforming adaptor 41 of the present invention by combining the transforming adaptors 21 and 22 (first stage) of FIG. 3.

First, the combined transforming adaptor made by combining the transforming adaptors 21 and 22 of FIG. 3 may be expressed as shown in FIG. 14A. In the figure are included adding means and multiplying means which are not used for the calculation. That is, since the resistor is connected, $C_2 = 0$, therefore $d_3$ is not used.

Therefore, the adding means A0 can be replaced with a $-1$ multiplier M1 and the adding means A1 and A2 in the figure and the lines connected to the same are eliminated. By doing this, the simplified wiring diagram of FIG. 14B is obtained.

Figure 14B:
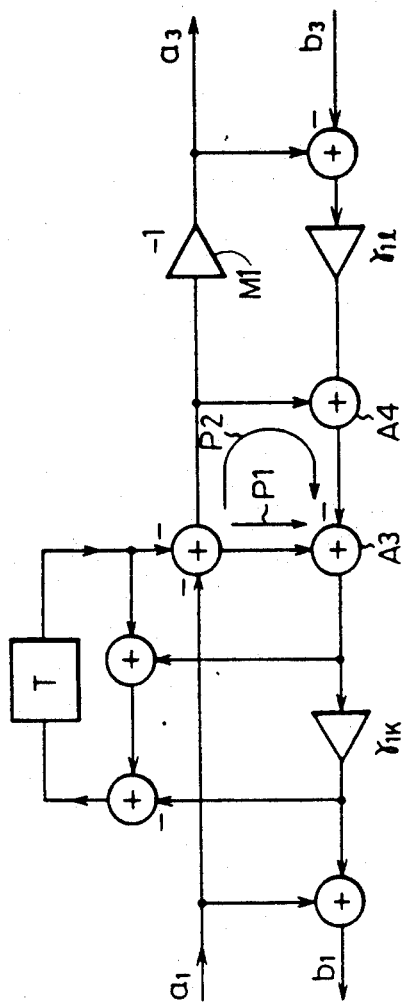

Considering further FIG. 14B, the operations through the path P1 and path P2 in the figure result in zero through plus and minus at the adding means A3, meaning that equivalently they do not actually exist. Therefore, the adding means A3 and A4 and the lines connecting the same are eliminated. By doing this, the simplified wiring diagram of FIG. 14C is obtained.

Figure 14C:
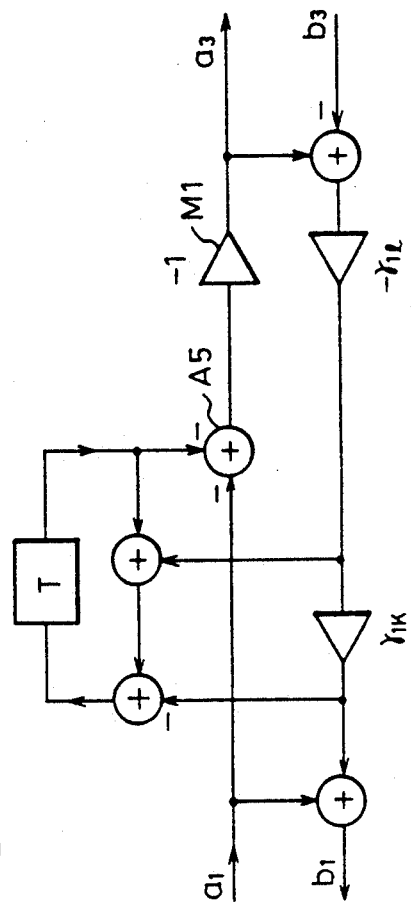

Considering further FIG. 14C, it will be understood that, by changing the minus ports ($-$) of the adder A5 to plus ports ($+$), it is possible to eliminate the multiplier M1 (multiplier $-1$). By doing this, the simplified wiring diagram of FIG. 14D is obtained.

Figure 14D:
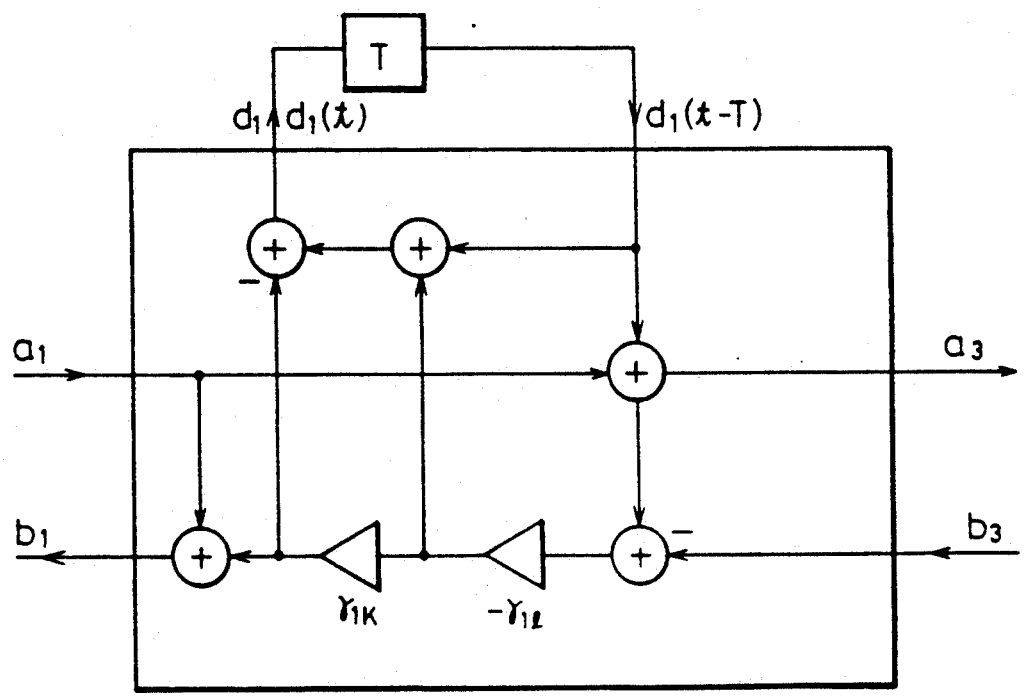

From FIG. 14D, if $b_1$, $a_3$, and $d_1$ are calculated, the above-mentioned equation (30), equation (31), and equation (32) are obtained.

Figure 15A:
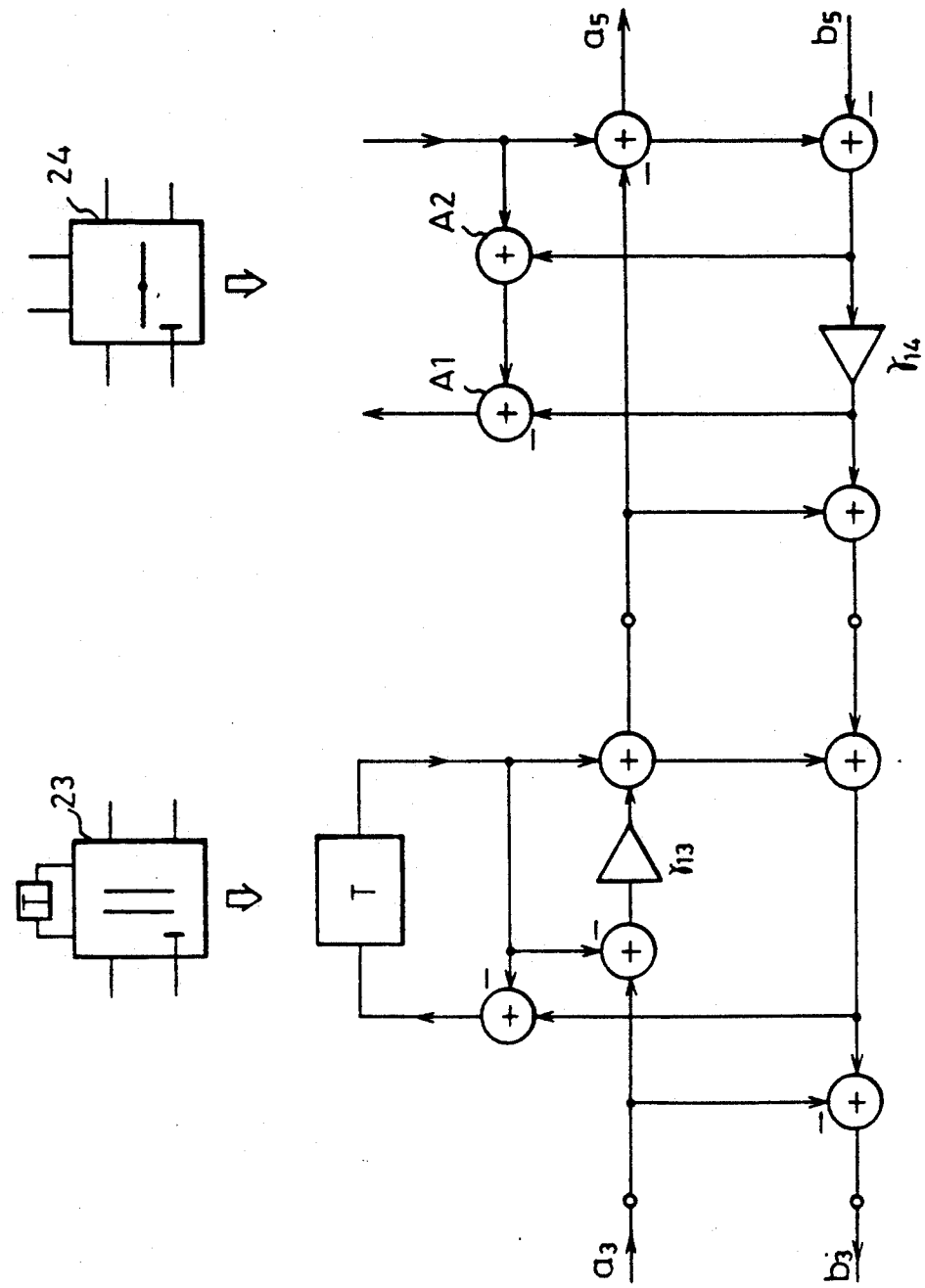
FIGS. 15A, 15B, and 15C are wiring diagrams showing the procedure for forming a combined transforming adaptor 41 of the present invention by combining the transforming adaptors 23 and 24 (second stage) of FIG. 3.
Figure 15B:
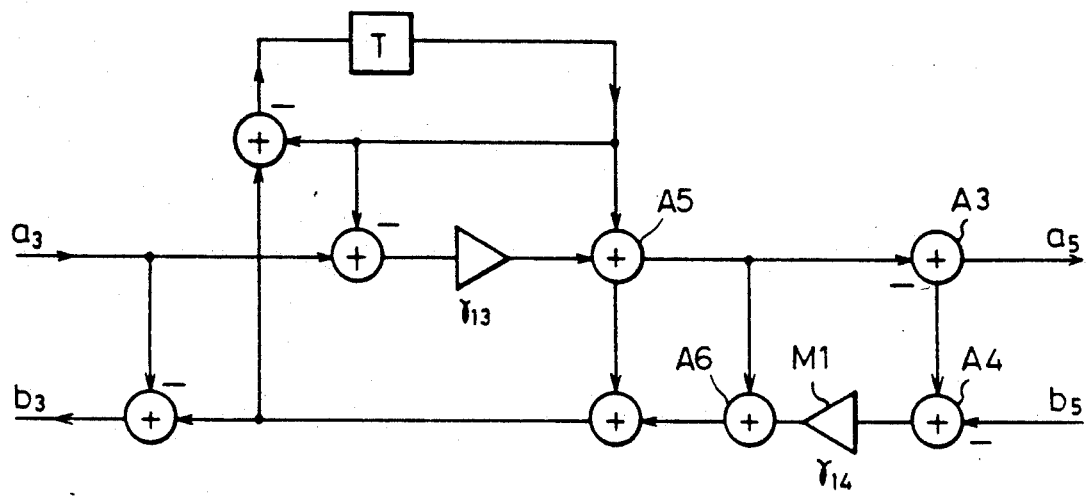
Figure 15C:
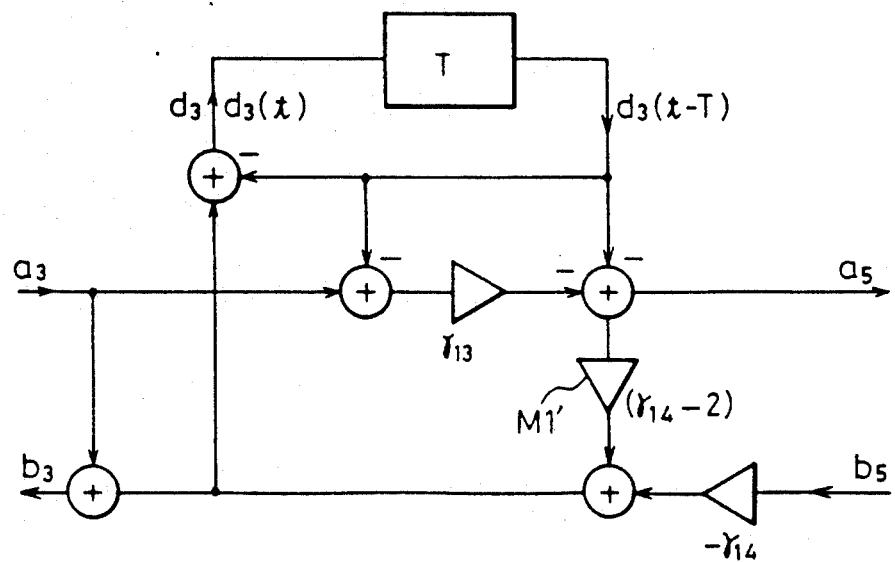

FIGS. 15A, 15B, and 15C are views showing the procedure for forming a combined transforming adaptor 41 of the present invention by combining the transforming adaptors 23 and 24 (second stage) of FIG. 3. First, considering FIG. 15A, the output $d_4$ and the input $c_4$ of the transforming adaptor 24 corresponding to the resistor are not used, so the adding means A1 and A2 and the lines connecting to the same in the figure may be eliminated. By doing this, the simplified wiring diagram of FIG. 15B is obtained.

Considering further FIG. 15B, it will be understood that the adding means A3 and A4 in the figure may be eliminated, the negative input of adding means A3 may be transferred to the inputs of adding means A5 and the multiplier of the multiplying means M1 be changed from $\gamma_{14}$ to $\gamma_{14}$, and in addition to eliminating adding means A6 and adding multiplying means M1' at another location with a multiplier of 4-2. By doing this, the simplified wiring diagram of FIG. 15C is obtained.

From FIG. 15C, if $b_3$, $a_5$, and $d_3$ are calculated, the above-mentioned equation (33), equation (34), and equation (35) are obtained.

Figure 16A:
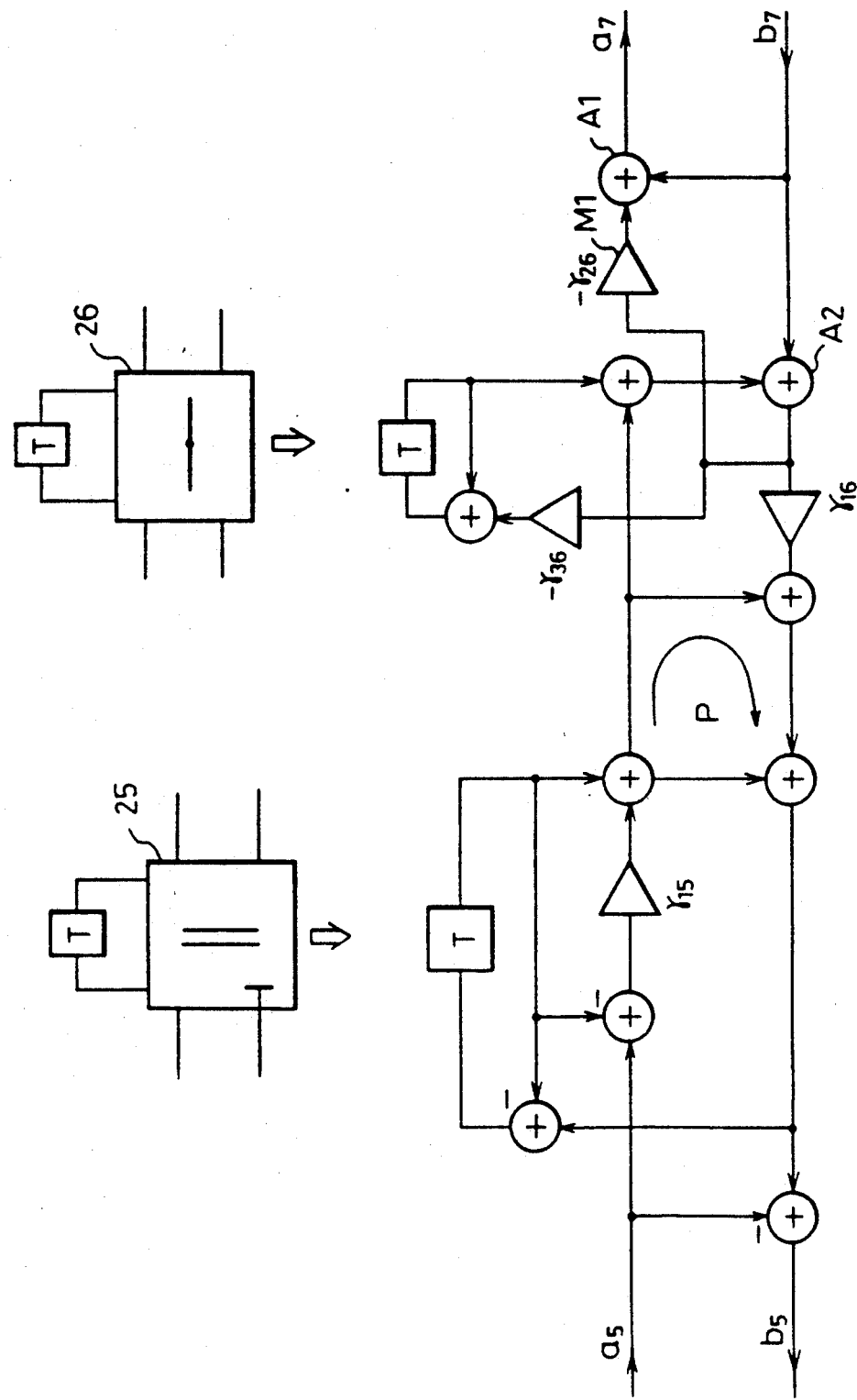
FIGS. 16A, 16B, and 16C are wiring diagrams showing the procedures for forming a combined transforming adaptor 41 of the present invention by combining the transforming adaptors 25 and 26 (third stage) of FIG. 3.
Figure 16B:
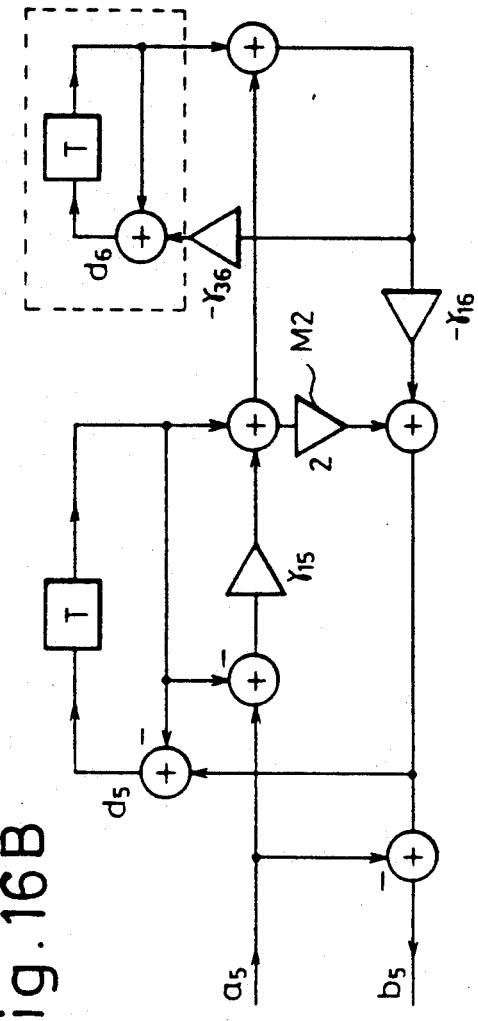
Figure 16C:
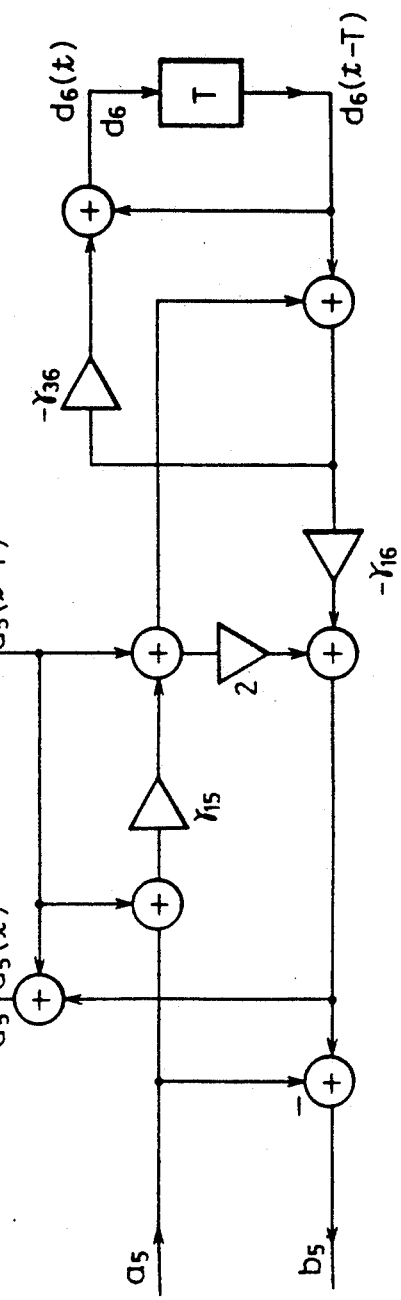

FIGS. 16A, 16B, and 16C are views showing the procedures for forming a combined transforming adaptor 41 of the present invention by combining the transforming adaptors 25 and 26 (third stage) of FIG. 3. First in FIG. 16A, the transforming adaptor 26 has the general format of FIG. 10 and not the simplified format of FIG. 12. This is because the transforming adaptor 26 is at the final stage, so the condition of the port impedance, that is, $RT_2 = RT_1 + RT_3$, does not stand. Therefore, the adaptor 26 cannot be simplified as in FIG. 12. That is, $\gamma_{36} \neq 1$.

Considering FIG. 16A, the path P in the figure is a redundant step in the calculation. This is eliminated and replaced with the multiplying means M2 (multiplier 2) shown in FIG. 16B.

Further, in FIG. 16A, the output $a_7$ and the input $b_7$ are resistive terminations, so are not used. In the final analysis the multiplying means M1 and the adding means A1 are not needed. Therefore, the lines connecting to these and the adding means A2 are also not needed. This being so, the simplified wiring diagram of FIG. 16B is obtained.

FIG. 16C is a wiring diagram including the portion in the dotted line in FIG. 16B turned 90° clockwise.

From FIG. 16C (or FIG. 16B), if $b_5$, $d_5$, and $d_6$ are calculated, the above-mentioned equation (36), equation (37), and equation (38) are obtained.

The present invention has as its subject the compression of the amount of operations in the wave digital filter type balancing network. By applying the present invention, the number of operations in the wave digital filter type balancing network can be reduced by more than 40 steps. This figure may seem small, but in actuality the effect is great. For example, when the cable equalization of a PCM transmission apparatus, the level setting, the balancing network processing, and other matters, which conventionally are processed in an analog form, are performed by using a general purpose DSP, 2 channel processings by a single DSP.LSI is demanded from the viewpoint of the consumed power. Here, considering the fact that the series of operations has to be performed in over 600 steps per channel, the effect may be said to be large. In extreme cases, due to the 40 steps, one DSP.LSI can be allocated per channel. In such a case, there is a clear effect in terms of the cost, size, consumed power, etc.

In actuality, the number of operation steps often exceeds 600 steps and, in some cases, processings which should inherently be performed by the DSP are performed by other hardware. Seen from this angle, the cooperating hardware too is also greatly reduced in size.

The wave digital filter type balancing network proposed here may find applications in subscriber line circuits in exchange offices linked by pair cables with subscriber terminal equipment.

I claim:

1. A wave digital filter corresponding to a plurality of capacitors and a plurality of resistors operatively connected to said plurality of capacitors, said wave digital filter comprising:
   individual transforming adaptors having operational functions connected in cascade, said individual transforming adaptors corresponding to the resistors connected in cascade with adjoining transforming adaptors to form combined transforming adaptors such that the operational functions are combined, each transforming adaptor including
   a first adder receiving first and second inputs and producing an output, a first incoming wave received as the first input;
   a second adder, operatively connected to said first adder, receiving a second incoming wave as a first input, receiving the output of said first adder as a second input and producing an output;
   a first multiplier, operatively connected to said second adder, performing a predetermined multiplication operation on the output from said second adder and providing an output;
   a second multiplier, operatively connected to said first multiplier, performing a predetermined multiplication operation on the output from said first multiplier and providing an output;
   a third adder, operatively connected to said second multiplier, receiving the output from said second multiplier as a first input, receiving a third incoming wave as a second input and outputting a reflected wave;
   a fourth adder, operatively connected to said second multiplier, receiving the output from said second multiplier as a first input and providing an output;
   a delay element, operatively connected to said first and fourth adders, receiving the output from said fourth adder and providing a delayed signal as the second input of said first adder; and
   a fifth adder, operatively connected to said delay element and said fourth adder, receiving the output from said delay element as a first input, receiving the output from said first multiplier as a second input and providing a summed signal as the second input of said fourth adder.

2. A transferring adaptor for a wave digital filter as set forth in claim 1 wherein, pairs of transforming adaptors are formed by combining simplified individual transforming adaptors, at least one of said adding means, multiplying means, and lines being eliminated to form a simplified structure of combined transforming adaptors.

3. A balancing network comprising:
   a first combined transforming adaptor corresponding to a capacitor and a resistor connected in series with a signal path, said first combined transforming adaptor comprising:
   a first adder for receiving as a first input an incoming wave at an input, outputting said incoming wave at a first output and outputting a signal at a second output;
   a second adder, operatively connected to said first adder, for receiving as a first input said incoming wave at an input side and receiving as a second input a second output of said first adder and providing an output;
   a first multiplier, operatively connected to said second adder, for performing a predetermined multiplication operation on the output of said second adder and providing an output;
   a second multiplier, operatively connected to said first multiplier for performing a predetermined multiplication operation on the output of said first multiplier;
   a third adder, operatively connected to said second multiplier, for receiving as a first input an output of said second multiplier, receiving as a second output said incoming wave at the input side, and outputting said reflected wave at an output;
   a fourth adder, operatively connected to said first and fourth adders, for receiving as an input the output of said fourth adder and providing an output which becomes the second input of said first adder; and
   a fifth adder, operatively connected to said delay element, said first multiplier and said fourth adder, for receiving as a first input the output of said delay element, receiving as a second input the output of said first multiplier, and providing an output to a second input of said fourth adder;
   a second combined transforming adaptor, connected in cascade with said first transforming adaptor corresponding to a capacitor connected in parallel and a resistor connected in series with the signal path, said second combined transforming adaptor comprising:
   a sixth adder for receiving as a first input an incoming wave at an input side and providing an output;
   a third multiplier, operatively connected to said sixth adder, and performing a predetermined multiplication operation on the output of said sixth adder and providing an output;

a seventh adder, operatively connected to said third multiplier, for receiving as a first input an output of said third multiplier, outputting said incoming wave at an output side as a first output and outputting a second output;

a fourth multiplier, operatively connected to said sixth adder, for performing a predetermined multiplication operation on the second output of said seventh adder and providing an output;

an eighth adder, operatively connected to said fourth multiplier, for receiving as a first input an output of said fourth multiplier and providing an output;

a fifth multiplier, operatively connected to said eighth adder, for performing a predetermined multiplication operation on a reflected wave at an input side and providing an output to a second input of said eighth adder;

a ninth adder, operatively connected to said eighth adder, for receiving as a first input an output of said eighth adder, receiving as a second input an incoming wave at the input side, and outputting said reflected wave at the output side;

a tenth adder, operatively connected to said eighth adder, for receiving as a first input the output of said eighth adder and providing an output; and a delay element operatively connected to said sixth, seventh and tenth adders, for receiving as an input the output of said tenth adder and providing an output to a second input of said seventh adder, a second input of said sixth adder, and a second input of said tenth adder; and a third combined transforming adaptor, connected in cascade with said second combined transforming adaptor, corresponding to a first capacitor connected in parallel and a second capacitor connected in series with the signal path, said third combined transforming adaptor comprising:

an eleventh adder for receiving an incoming wave as a first input and providing an output;

a sixth multiplier, operatively connected to said eleventh adder, for performing a predetermined multiplication operation on the output of said eleventh adder and providing an output signal;

a twelfth adder, operatively connected to said sixth multiplier, for receiving as a first input an output of sixth multiplier and providing an output;

a thirteenth adder, operatively connected to said twelfth adder, for receiving as a first input a first output of said twelfth adder and providing an output;

a seventh multiplier, operatively connected to said thirteenth adder, for performing a predetermined multiplication operation on the output of said thirteenth adder and providing an output;

a fourteenth adder, operatively connected to said seventh multiplier, for receiving as a first input the output of said seventh multiplier and providing an output;

a first delay element, operatively connected to said thirteenth and fourteenth adders, for receiving as an input the output of said fourteenth adder and providing an output to second inputs of said thirteenth and fourteenth adders;

an eighth multiplier, operatively connected to said thirteenth adder, for performing a predetermined multiplication operation on the output of said thirteenth adder and providing an output;

a fifteenth adder, operatively connected to said eighth multiplier, for receiving as a first input the output of said eighth multiplier and providing an output;

a ninth multiplier, operatively connected to said twelfth and fifteenth adders, for performing a predetermined multiplication operation on the second output of said twelfth adder and providing an output to a second input of said fifteenth adder;

a sixteenth adder, operatively connected to said fifteenth adder, for receiving as a first input the output of said fifteenth adder, receiving as a second input said incoming wave, and outputting a reflected wave;

a seventeenth adder, operatively connected to said fifteenth adder, for receiving as a first input the output of said fifteenth adder and providing an output; and a second delay element, operatively connected to said eleventh, twelfth and seventeenth adders, for receiving as an input the output of said seventeenth adder and providing an output to second inputs of said eleventh adder, twelfth adder, and seventeenth adder.

4. A balancing network, comprising:

a wave digital filter, corresponding to a plurality of resistors and capacitors, formed of individual transforming adaptors having operational functions connected in cascade, said individual transforming adaptors corresponding to the resistors connected in cascade with adjoining transforming adaptors to form combined transforming adaptors such that the operational functions are combined, each transforming adaptor including a first adder receiving first and second inputs and producing an output, a first incoming wave received as the first input;

a second adder, operatively connected to said first adder, receiving a second incoming wave as a first input, receiving the output of said first adder as a second input and producing an output;

a first multiplier, operatively connected to said second adder, performing a predetermined multiplication operation on the output from said second adder and providing an output;

a second multiplier, operatively connected to said first multiplier, performing a predetermined multiplication operation on the output from said first multiplier and providing an output;

a third adder, operatively connected to said second multiplier, receiving the output from said second multiplier as a first input, receiving a third incoming wave as a second input and outputting a reflected wave;

a fourth adder, operatively connected to said second multiplier, receiving the output from said second multiplier as a first input and providing an output;

a delay element, operatively connected to said first and fourth adders, receiving the output from said fourth adder and providing a delayed signal as the second input of said first adder; and a fifth adder, operatively connected to said delay element and said fourth adder, receiving the output from said delay element as a first input, receiving the output from said first multiplier as a second input and providing a summed signal as the second input of said fourth adder; and an oversampling clock ($CK_n$) having a frequency n, n being an integer greater than or equal to 2, and a basic sampling clock (CK), filter operations performed in said basic sampling clocks (CK) divided into n times to obtain a discrete filter output (OUT) for each basic sampling clock, and forming each of said individual transforming adaptors by n times a number of sectional combined transforming adaptors, values of filter coefficients being made different between said sectional combined transforming adaptors for each of said individual transforming adaptors.

5. A balancing network as set forth in claim 4, wherein n=2 and comprising:

first and second sectional combined transforming adaptors comprised by dividing a 3-port pair combined transforming adaptor in two including a capacitor and a resistor connected in series with a signal path;

third and fourth sectional combined transforming adaptors comprised by dividing a 3-port pair transforming adaptor in two including a capacitor connected in parallel and a resistor connected in series with said signal path;

fifth and sixth sectional combined transforming adaptors comprised by dividing a 3-port pair transforming adaptor in two including a first capacitor connected in parallel and a second capacitor connected in series with said signal path;

said first, third, and fifth sectional combined transforming adaptors being connected in cascade and said second, fourth, and sixth sectional combined transforming adaptors connected in cascade;

first and second delay elements connected in series between third port pairs other than said two port pairs connected in cascade in said first sectional combined transforming adaptor and outputting a signal appearing at the intermediate connection point to said second sectional combined transforming adaptor;

a third delay element commonly connected in parallel between said third port pairs other than said two port pairs connected in cascade by said third and fourth sectional combined transforming adaptors;

a fourth delay element commonly connected in parallel between said third port pairs other than said port pairs connected in cascade by said fifth and sixth sectional combined transforming adaptors; and fifth and sixth delay elements connected in series between the remaining third port pairs of said sixth section combined transforming adaptor and outputting a signal appearing at the intermediate connection point to said fifth sectional combined transforming adaptor;

a first switch pair outputting an incoming wave selectively and alternately to said first sectional combined transforming adaptor and said second sectional combined transforming adaptor which outputs the reflected wave;

a second switch pair selectively and alternately connecting one end of said third delay element to said third port pair side of said third sectional combined transforming adaptor side or said third port pair of said fourth sectional combined transforming adaptor side;

a third switch pair selectively and alternately connecting the other end of said third delay element to said third port pair side of said third sectional combined transforming adaptor or said third port pair side of said fourth sectional combined transforming adaptor side and which turns on/off complementarily with said second switch pair;

a fourth switch pair selectively and alternately connecting one end of said fourth delay element to said third port pair side of said fifth sectional combined transforming adaptor side or said third port pair of said sixth sectional combined transforming adaptor side; and a fifth switch pair selectively and alternately connecting the other end of said fourth delay element to said third port pair side of said fifth sectional combined transforming adaptor or said third port pair side of said sixth sectional combined transforming adaptor side, turning on/off complementarily with said fourth switch pair.

6. A balancing network disposed in a terminal office connected to subscribers by 2-wire type pair cables and connected between a transmission side and a reception side of a transmission line between the terminal office and another terminal office, said balancing network comprising:

a first combined transforming adaptor corresponding to a capacitor and a resistor connected in series to a signal path;

a second combined transforming adaptor corresponding to a capacitor connected in parallel ana resistor connected in series to the signal path; and a third combined transforming adaptor corresponding to a first capacitor connected in parallel and a second capacitor connected in series to the signal path, each of said first, second and third transforming adaptors formed of 3-port pair transforming adaptors, having a plurality of adders and multipliers connected in a simplified structure, in a cascade connection with the 3-port pair transforming adaptors corresponding to resistors having port pairs other than two port pairs used for the cascade connection removed and combined with adjoining 3-port pair transforming adaptors corresponding to capacitors.

7. A balancing network as set forth in claim 6, wherein said first combined transforming adaptor comprises:

a first adder for receiving as a first input an incoming wave at an input side and outputting said incoming wave at an output side to a first output;

a second adder, operatively connected to said first adder, for receiving as a first input an incoming wave at an input side and receiving as a second input a second output of said first adder and providing an output;

a first multiplier, operatively connected to second adder, for performing a predetermined multiplication operation on the output of said second adder and providing an output;

a second multiplier, operatively connected to said first multiplier, for performing a predetermined multiplication operation on the output of said first multiplier and providing an output;

a third adder, operatively connected to said second multiplier, for receiving as a first input an output of said second multiplier, receiving as a second output said incoming wave at an input side, and outputting said reflected wave at an output side;

a fourth adder, operatively connected to said second multiplier, for receiving as a first input the output of said second multiplier and providing an output;

a delay element, operatively connected to said first and fourth adders, for receiving as an input the output of said fourth adder and providing an output to the second input of said first adder; and a fifth adder, operatively connected to said delay element, said first multiplier and said second and fourth adders, for receiving as a first input the output of said delay element, receiving as a second input the output of said first multiplier, and providing an output to the second input of said fourth adder.

8. A balancing network as set forth in claim 6, wherein said second combined transforming adaptor comprises:

a first adder for receiving as a first input an incoming wave at an input side and providing an output;

a first multiplier, operatively connected to said first adder, for performing a predetermined multiplication operation on the output of said first adder and providing an output;

a second adder, operatively connected to said first multiplier, for receiving as a first input an output of said first multiplier and outputting said incoming wave at an output side as a first output and providing a second output;

a second multiplier, operatively connected to said second adder, for performing a predetermined multiplication operation on the second output of said second adder and providing an output;

a third adder, operatively connected to said second multiplier, for receiving as a first input an output of said second multiplier and providing an output;

a third multiplier, operatively connected to said third adder, for performing a predetermined multiplication operation on a reflected wave at an input side and outputting an output to the second input of said third adder;

a fourth adder, operatively connected to said third adder, for receiving as a first input an output of said third adder, receiving as a second input said incoming wave at the input side, and outputting said reflected wave at an output side;

a fifth adder, operatively connected to said third adder, for receiving as a first input the output of said third adder and providing an output; and a delay element, operatively connected to said fifth adder, said second adder and said first adder, for receiving as an input the output of said fifth adder and providing an output to the second input of said second adder, a second input of said first adder, and a second input of said fifth adder.

9. A balancing network as set forth in claim 6, wherein said third combined transforming adaptor comprises:

a first adder for receiving as a first input an incoming wave and providing an output;

a first multiplier, operatively connected to said first adder, for performing a predetermined multiplication operation on the output of said first adder and providing an output;

a second adder, operatively connected to said first multiplier, for receiving as a first input an output of said first multiplier and providing an output;

a third adder, operatively connected to said second adder, for receiving as a first input a first output of said second adder and providing an output;

a second multiplier, operatively connected to said third adder, for performing a predetermined multiplication operation on the output of said third adder and providing an output;

a fourth adder, operatively connected to said second multiplier, for receiving as a first input the output of said second multiplier and providing an output;

a first delay element, operatively connected to said third and fourth adders, for receiving as an input an output of said fourth adder and providing an output to the second inputs of said third and fourth adders;

a third multiplier, operatively connected to said third adder, for performing a predetermined multiplication operation on the output of said third adder and providing an output;

a fifth adder, operatively connected to said third multiplier, for receiving as a first input the output of said third multiplier;

a fourth multiplier, operatively connected to said second and fifth adders, for performing a predetermined multiplication operation on the second output of said second adder and providing an output to a second input of said fifth adder;

a sixth adder, operatively connected to said fifth adder, for receiving as a first input the output of said fifth adder, receiving as a second input said incoming wave, and outputting a reflected wave;

a seventh adder, operatively connected to said fifth adder, for receiving as a first input the output of said fifth adder and providing an output;

a second delay element, operatively connected to said first, second and seventh adders, for receiving as an input the output of said seventh adder and providing an output to second inputs of said first adder, second adder, and seventh adder.

10. A balancing network as set forth in claim 6, wherein said combined transforming adaptors are connected in cascade to form an echo canceler.

11. A wave digital filter corresponding to a plurality of capacitors and a plurality of resistors operatively connected to said plurality of capacitors, said wave digital filter comprising:

a capacitor connected in parallel with respect to a signal path;

a resistor connected in series with respect to the signal path; and individual transforming adaptors having operational functions connected in cascade, said individual transforming adaptors corresponding to the resistors connected in cascade with adjoining transforming adaptors to form combined transforming adaptors such that the operational functions are combined, each transforming adaptor including:

a first adder for receiving an incoming wave as a first input and providing an output signal;

a first multiplier, operatively connected to said first adder, for performing a predetermined multiplication operation on the output signal from said first adder and outputting an output signal;

a second adder, operatively connected to said first multiplier, for receiving as a first input the output signal from said first multiplier, outputting said incoming wave as a first output and outputting an output signal as a second output;

a second multiplier, operatively connected to said second adder, for performing a predetermined multiplication operation on the second output signal from said second adder and outputting an output signal;

a third adder, operatively connected to said second multiplier, for receiving as a first input the output signal from said second multiplier;

a third multiplier, operatively connected to said third adder, for performing a predetermined multiplication operation on a reflected wave at an input side and outputting the output to a second input of said third adder;

a fourth adder, operatively connected to said third adder, for receiving as a first input an output of said third adder, for receiving as a second input the incoming wave, and outputting the reflected wave;

a fifth adder, operatively connected to said third adder, for receiving as a first input the output from said third adder; and a delay element, operatively connected to said fifth adder and said second adder, for receiving as an input the output of said fifth adder and providing an output to the second input of said second adder, the second input of said first adder, and the second input of said fifth adder.

12. A wave digital filter corresponding to a plurality of capacitors and a plurality of resistors operatively connected to said plurality of capacitors, said wave digital filter comprising:

a first capacitor connected in parallel to a signal path;

a second capacitor connected in series to the signal path;

individual transforming adaptors having operational functions connected in cascade, said individual transforming adaptors corresponding to the resistors connected in cascade with adjoining transforming adaptors to form combined transforming adaptors such that the operational functions are combined, each transforming adaptor including:

a first adder receiving an incoming wave as a first input and providing an output;

a first multiplier, operatively connected to said first adder, for performing a predetermined multiplication operation on the output of said first adder and providing an output;

a second adder, operatively connected to said first multiplier, for receiving as a first input the output of said first multiplier and providing an output;

a third adder, operatively connected to said second adder, for receiving as a first input a first output of said second adder and providing an output;

a second multiplier, operatively connected to said third adder, for performing a predetermined multiplication operation on the output of said third adder and providing an output;

a fourth adder, operatively connected to said second multiplier, for receiving as a first input the output of said second multiplier and providing an output;

a first delay element, operatively connected to said third and fourth adders, for receiving as an input an output of said fourth adder and providing a second input to said third adder and said fourth adder;

a third multiplier, operatively connected to said third adder, for performing a predetermined multiplication operation on the output of said third adder and providing an output;

a fifth adder, operatively connected to said third multiplier, for receiving as a first input the output of said third multiplier;

a fourth multiplier, operatively connected to said second and fifth adders, for performing a predetermined multiplication operation on a second output of said second adder and providing an output signal to a second input of said fifth adder;

a sixth adder, operatively connected to said fifth adder, for receiving as a first input the output of said fifth adder, for receiving as a second input said incoming wave, and outputting a reflected wave;

a seventh adder, operatively connected to said fifth adder, for receiving as a first input the output of said fifth adder and providing an output; and a second delay element, operatively connected to said seventh adder, for receiving as an input the output of said seventh adder and providing an output signal to said second inputs of said first adder, second adder, and seventh adder.

* * * * *

UNITED STATES PATENT AND TRADEMARK OFFICE
CERTIFICATE OF CORRECTION

PATENT NO. : 5,249,145
DATED : SEPTEMBER 28, 1993
INVENTOR(S) : MITSUO KAKUISHI

It is certified that error appears in the above-indentified patent and that said Letters Patent is hereby corrected as shown below:

Col. 7, line 38, "is" should be --are--;
       line 60, "for results" should be --for storing the results--.

Col. 11, line 20, "as" should be deleted;
       line 62, "result" should be --a good result--;
       line 64, "R = O," should be --$R_1$ = O--.

Col. 15, line 64, "$C_z$ = 1.08$\mu$F)" should be --$C_x$ = 1.08$\mu$F)--.

Col. 20, line 36, "M1 be" should be --M1 may be--;
       line 39, "4-2" should be --$\gamma_{14}^{-2}$--.

Col. 26, line 32, "ana" should be --and a--.

Signed and Sealed this

Seventh Day of June, 1994

Attest:

BRUCE LEHMAN

Attesting Officer     Commissioner of Patents and Trademarks